United States Patent
Fan et al.

(10) Patent No.: US 9,966,000 B2
(45) Date of Patent: May 8, 2018

(54) ELECTRO-STATIC DISCHARGE AND ELECTRIC OVERSTRESS PROTECTION STRATEGY FOR MICRO-CHIP ARRAY ON PANEL

(71) Applicant: Apple Inc., Cupertino, CA (US)

(72) Inventors: Xiaofeng Fan, Cupertino, CA (US); Andreas Bibl, Los Gatos, CA (US); Kapil V. Sakariya, Los Altos, CA (US); Tore Nauta, Santa Cruz, CA (US)

(73) Assignee: APPLE INC., Cupertino, CA (US)

( * ) Notice: Subject to any disclaimer, the term of this patent is extended or adjusted under 35 U.S.C. 154(b) by 0 days. days.

(21) Appl. No.: 14/864,798

(22) Filed: Sep. 24, 2015

(65) Prior Publication Data

US 2016/0210895 A1    Jul. 21, 2016

Related U.S. Application Data

(60) Provisional application No. 62/104,663, filed on Jan. 16, 2015.

(51) Int. Cl.
  *G09G 5/00*         (2006.01)
  *G09G 3/3208*       (2016.01)
  (Continued)

(52) U.S. Cl.
  CPC ............. *G09G 3/3208* (2013.01); *G09G 3/20* (2013.01); *H01L 25/167* (2013.01);
  (Continued)

(58) Field of Classification Search
  CPC ... H01L 51/50; H01L 27/0248; H01L 27/124; H01L 27/0266; G09G 3/3648;
  (Continued)

(56) References Cited

U.S. PATENT DOCUMENTS

| 8,508,517 B2 | 8/2013 | Asada et al. |
| 2008/0001895 A1* | 1/2008 | Choi ................... G09G 3/3648 345/98 |

(Continued)

FOREIGN PATENT DOCUMENTS

| CN | 2 886 737 Y | 4/2007 |
| EP | 2 023 193 A1 | 2/2009 |
| GB | 2 484 713 A | 4/2012 |

OTHER PUBLICATIONS

PCT International Search Report and Written Opinion for International Application No. PCT/US2015/067214, dated Mar. 10, 2016, 12 pages.

(Continued)

*Primary Examiner* — Abdul-Samad A Adediran
(74) *Attorney, Agent, or Firm* — Rutan & Tucker, LLP

(57) ABSTRACT

A display system includes an array of light emitting diodes (LEDs), first and second driver chips, and one or more protection chips on a display substrate. The first and second driver chips are to drive a first group of LEDs of the array of LEDs and a second group of LEDs of the array of LEDs, respectively. Each protection chip includes one or more electro-static discharge (ESD) protection devices to assist with protecting the driver chips from damage caused by an ESD event. In one embodiment, each ESD protection device is connected between one or more signal lines, one or more power supply voltage lines, and an electrical ground line of the display substrate. In one embodiment, at least one protection chip comprises one or more electric overstress (EOS) protection devices to assist with protecting the driver chips from damage caused by an EOS event.

20 Claims, 17 Drawing Sheets

(51) Int. Cl.
*G09G 3/20* (2006.01)
*H01L 27/02* (2006.01)
*H01L 25/16* (2006.01)
*H02H 9/04* (2006.01)

(52) U.S. Cl.
CPC ......... *H01L 27/0248* (2013.01); *H02H 9/046* (2013.01); *G09G 2330/04* (2013.01); *H01L 2924/0002* (2013.01)

(58) Field of Classification Search
CPC .......... G09G 3/3225; G09G 3/20; H05K 7/06; G02F 1/136204; H04N 17/04; G06F 3/0412
USPC ....... 257/43, 59; 324/555; 345/98, 212, 175; 348/87; 349/40; 361/748
See application file for complete search history.

(56) References Cited

U.S. PATENT DOCUMENTS

| | | | |
|---|---|---|---|
| 2008/0218652 A1* | 9/2008 | Kim | G02F 1/136204 349/40 |
| 2009/0102995 A1* | 4/2009 | Kim | H01L 27/0248 349/40 |
| 2009/0279008 A1* | 11/2009 | Lee | H01L 27/0248 349/40 |
| 2010/0045647 A1 | 2/2010 | Kim et al. | |
| 2011/0109322 A1* | 5/2011 | Shi | H04N 17/04 324/555 |
| 2011/0199019 A1 | 8/2011 | McClear et al. | |
| 2012/0032942 A1* | 2/2012 | Toyotaka | G09G 3/20 345/212 |
| 2012/0092361 A1 | 4/2012 | Saitoh | |
| 2013/0062607 A1* | 3/2013 | Yamazaki | H01L 27/0266 257/59 |
| 2013/0229597 A1 | 9/2013 | Park et al. | |
| 2014/0232289 A1 | 8/2014 | Brandes et al. | |
| 2014/0267683 A1* | 9/2014 | Bibl | H01L 51/50 348/87 |
| 2014/0291667 A1* | 10/2014 | Nakada | H01L 27/124 257/43 |
| 2014/0340379 A1* | 11/2014 | Kim | G09G 3/3225 345/212 |
| 2015/0169011 A1* | 6/2015 | Bibl | G06F 3/0412 345/175 |
| 2015/0222032 A1* | 8/2015 | Goo | H05K 7/06 361/748 |

OTHER PUBLICATIONS

PCT International Preliminary Report on Patentability for International Application No. PCT/US2015/067214, dated Jul. 27, 2017, 8 pages.

* cited by examiner

ELECTRO-STATIC DISCHARGE AND ELECTRIC OVERSTRESS PROTECTION STRATEGY FOR MICRO-CHIP ARRAY ON PANEL

RELATED APPLICATION

This application claims the benefit of priority from U.S. Provisional Patent Application Ser. No. 62/104,663, filed on Jan. 16, 2015, the full disclosure of which is incorporated herein by reference.

BACKGROUND

Field

Embodiments relate to protection of an electronic system from an electrical failure mode. Specifically, the embodiments relate to protection of devices of an electronic system from damage caused by electro-static discharge (ESD) and/or electric overstress (EOS).

Background Information

Many electronic systems, such as display systems, include integrated circuits (ICs), light emitting devices, and other devices. Protection against damage caused by electro-static discharge (ESD) events and/or electric overstress (EOS) events during and after fabrication of these electronic systems is important. As the sizes of the integrated circuits (ICs), light emitting devices, and the other devices in these electronic systems continue to shrink, protection from ESD and/or EOS events is becoming increasingly important.

SUMMARY

Embodiments describe systems and methods that assist with protecting devices of an electronic system from an electronic failure mode using one or more protection chips on a substrate of the electronic system. In one embodiment, the electronic system is a display system. In one embodiment, the display system includes a display substrate, an array of light emitting diodes (LEDs), a first driver chip, a second driver chip, and a protection chip. In one embodiment, the array of LEDs, the first driver chip, the second driver chip, and the protection chip are on the display substrate. In one embodiment, the first driver chip is to drive a first group of LEDs of the array of LEDs, and the second driver chip is to drive a second group of LEDs of the array of LEDs. In one embodiment, the protection chip is to assist with protection of the first and second driver chips, the array of LEDs, and/or other devices of the display system from an electronic failure mode. In one embodiment, the protection chip is to assist with protection of the array of LEDs, the first and second driver chips, one or more other devices on the display substrate, one or more devices connected to the display substrate, and/or the display substrate itself from damage caused by one or more ESD and/or EOS events during fabrication and subsequent use of the display system. In one embodiment, the protection chip is to assist with protection against damage caused by ESD and/or EOS events that occur because of rapid or gradual increases in the voltage of metal traces of the display substrate during fabrication of the display system. In one embodiment, the protection chip is to assist with protection against damage caused by ESD and/or EOS events that occur from a connection of a flex cable to the display substrate. In one embodiment, the protection chip is to assist with protection against damage caused by ESD and/or EOS events that occur because of activities performed after fabrication of the display system. In one embodiment, the protection chip is to assist with protection against damage caused by ESD and/or EOS events in the display system, where the display system includes at least one micro device.

In one embodiment, the protection chip includes at least one of (i) one or more electro-static discharge (ESD) devices to assist with protecting the devices of the display system from damage caused by one or more ESD events or (ii) one or more electric overstress (EOS) devices to assist with protecting the devices of the display system from damage caused by one or more EOS events. In one embodiment, the protection chip is connected to the devices of the display system (e.g., the first and second driver chips) through one or more signal lines, one or more power supply voltage lines, and an electrical ground line of the display substrate. In one embodiment, the one or more ESD protection devices and/or the one or more EOS protection devices of the protection chip are connected between the signal lines, the power supply lines, and the electrical ground line of the display substrate. The one or more ESD protection devices can be formed using at least one of a thyristor, a varistor, a polymer ESD device, a gas discharge tube, a gate-grounded Metal-Oxide-Semiconductor Field-Effect Transistor (MOSFET), a gate-coupled MOSFET, a silicon controlled rectifier (SCR), a medium voltage triggered SCR, or any other device known to deal with rapid ESD events. The one or more EOS devices can be formed using a thyristor, a diode string comprising a plurality of P-N junctions that are connected in series, a bidirectional or unidirectional diode-based Transient Voltage Suppressor (TVS), or any other device known to deal with slow EOS events. In one embodiment, at least one of the ESD or EOS protection devices of the protection chip includes a clamp device. In one embodiment, ESD and/or EOS protection is implemented by intentionally designed and calculated leakage through standard circuits that occurs during ESD and/or EOS events.

In some embodiments, at least one of the devices of the display system is a micro device. In one embodiment, at least one of the driver chips is a micro driver chip with a length and/or width that ranges from one μm to 300 μm. In many embodiments, the array of the LEDs includes at least one micro LED with a length and/or width that ranges from one μm to 300 μm. In some embodiments, the protection chip is a micro protection chip with a length and/or width that ranges from one μm to 300 μm, or more specifically, between that ranges from 20 μm to 300 μm. In one embodiment, the sizes of the ESD protection devices and/or EOS protection devices of the micro protection chip are scalable based on the size of the micro protection chip. In this way, even if conventional ESD and EOS protection devices cannot be used to assist with the protection of the array of LEDs, the first and second driver chips, one or more other devices on the display substrate, one or more devices connected to the display substrate, and/or the display substrate itself because the conventional ESD and/or EOS protection devices are too large to be included in the display system, the micro protection chip can be included in the display system to assist with protection of the array of LEDs, the first and second driver chips, the one or more other devices on the display substrate, the one or more devices connected to the display substrate, and/or the display substrate itself from damage caused by one or more ESD and/or EOS events. In one embodiment, multiple protection chips in the display system work in parallel to provide scalable ESD and/or EOS protection for all driver chips, signals, and devices in the display system. In one embodiment, the ESD and/or EOS protection devices inside each of the protection chips are used collectively in a distributed ESD and/or EOS protection scheme. In one embodiment, the distributed ESD and/or EOS protection scheme is designed so that the ESD and/or EOS protection devices in each of the protection chips works uniformly with the ESD and/or EOS protection devices of the other protection chips in the distributed protection scheme to achieve the scalability. In one embodiment, this scalability feature enables the protection chips to provide ESD and/or EOS protection to electronic systems (e.g., display systems, etc) having one or more micro devices. In one embodiment, the distributed ESD and/or EOS protection scheme is made up of the plurality of ESD and/or EOS protection devices of multiple protection devices. In one embodiment, each of the multiple protection chips in the distributed ESD and/or EOS protection scheme is in the scale of micrometers. In one embodiment, each of the ESD and/or EOS protection devices in the distributed ESD and/or EOS protection scheme are in the scale of micrometers. In one embodiment, the ESD and/or EOS protection devices in the distributed ESD and/or EOS protection scheme are designed to work in parallel to provide protection for the electronic system (e.g., a display system, etc). The effect of the distributed ESD and/or EOS protection scheme is the provision of ESD and/or EOS protection that is identical and/or even superior to the ESD and/or EOS protection provided by currently-available ESD and/or EOS circuits known in the art. For example, the distributed ESD protection scheme provides ESD protection that is at least equal to the ESD protection that is provided by one or more currently-available TVS diodes.

In one embodiment, one of the devices on the display substrate is a scan driver. In one embodiment, the protection chip assists with protecting the scan driver from damage caused by one or more ESD and/or EOS events. In one embodiment, the scan driver is connected to the protection chip and one or more of the other devices of the display system through one or more of the signal lines, one or more of the power supply lines, and the electrical ground line.

In some embodiments, one of the devices connected to the display substrate is a flex cable. In one embodiment, the flex cable is connected to the protection chip and/or one or more of the other devices of the display system through one or more of the signal lines, one or more of the power supply lines, and the electrical ground line of the display substrate. In one embodiment, the flex cable connects the display substrate to a timing controller (TCON) and/or other devices of the display system, such as a printed circuit board or a data driver. In one embodiment, the flex cable is located at or near an edge of a contact ledge of the display substrate. In one embodiment, the protection chip is on the display substrate at a location between a display area of the display substrate and an edge of a contact ledge of the display substrate. In one embodiment, the protection chip assists with protecting the array of LEDs, the first and second driver chips, one or more other devices on the display substrate, the flex cable, one or more other devices connected to the display substrate, and/or the display substrate itself from damage caused by one or more ESD and/or EOS events during a connection of the flex cable to the display substrate.

In one embodiment, one or more signals and one or more power supply voltages are provided through one or more of the signal lines, one or more of the power supply voltage lines, and the electrical ground line to the protection chip prior to being provided to any of the driver chips, other devices on the display substrate, and/or any devices connected to the display substrate to protect the driver chips, other devices on the display substrate, and/or any devices connected to the display substrate from damage caused by one or more ESD and/or EOS events.

In one embodiment, an inter-driver-chip line is one of the signal lines. In one embodiment, the inter-driver-chip line connects the first and second driver chip to each other and enables communication between the driver chips. The inter-driver-chip line can be a distribution line formed from a conductive metal or any other material that enables communication between the driver chips. In one embodiment, a small-scale protection device is connected between the first and second driver chips through one or more of the signal lines (e.g., the inter-driver-chip line), one or more of the power supply voltage lines, and the electrical ground line. In one embodiment, each of the driver chips includes the small-scale protection device. In one embodiment, the small-scale protection device includes smaller versions of the ESD protection devices and/or EOS protection devices of the protection chip. In one embodiment, the small-scale protection device is connected between the driver chips or included in each driver chip to assist with protection of the driver chips from damage caused by one or more EOS and/or ESD events.

In one embodiment, the protection chip includes the small-scale protection device to assist with protecting devices of the protection chip from damage caused by one or more ESD and/or EOS events.

In one embodiment, a method of forming a display system includes bonding a plurality of protection chips to a receiving display substrate, bonding an array of driver chips to the receiving display substrate, and transferring an array of LEDs onto the receiving display substrate. Each of the array of driver chips is to drive at least one of the array of LEDs. Each of the plurality of protection chips is to assist with protecting at least one of the driver chips from damage caused by one or more ESD and/or EOS events. Each of the plurality of protection chips includes at least one of (i) one or more electro-static discharge (ESD) protection devices to assist with protection against damage caused by one or more ESD events or (ii) one or more electrical overstress (EOS) protection devices to assist with protection against damage caused by one or more EOS events. In one embodiment, the one or more ESD and/or EOS protection devices of each of the plurality of protection chips are connected between one or more signal lines of the display substrate, one or more power supply lines of the display substrate, and an electrical ground line of the display substrate. In this way, the plurality of protection chips assists with the protection of the array of LEDs, the array of driver chips, one or more other devices on the display substrate, one or more devices connected to the display substrate, and/or the display substrate itself from damage caused by one or more ESD and/or EOS events. In one embodiment, at least one of the other devices on the display substrate includes at least one of a plurality of scan drivers. In one embodiment, at least one of the devices connected to the display substrate is a flex cable.

In one embodiment, the plurality of protection chips is transferred onto the receiving display substrate before any other device of the display system is transferred onto or connected to the receiving display substrate. In one embodiment, the protection chips and the driver chips are picked up from the same donor substrate. In one embodiment, the transferring of the array of LEDs, the transferring of the array of driver chips, the transferring of at least one of the scan drivers, the transferring of other devices to be placed or bonded onto the receiving display substrate, and/or the transferring of the plurality of protection chips onto the receiving display substrate is performed in one or more batches.

In one embodiment, the method includes connecting the plurality of protection chips to the array of driver chips and/or the other devices of display system via one or more of the signal lines, one or more of the power supply voltage lines, and the electrical ground line of the receiving display substrate.

In one embodiment, an inter-protection-chip line is one of the signal lines. In one embodiment, the inter-protection-chip line connects the protection chips to each other and enables communication between the protection chips. The inter-protection-chip line can be a distribution line formed from a conductive metal or any other material that enables communication between the protection chips. In one embodiment, a small-scale protection device is connected between each pair of protection chips through one or more of the signal lines (e.g., the inter-protection-chip line), one or more of the power supply voltage lines, and the electrical ground line. In one embodiment, each of the protection chips includes the small-scale protection device. In one embodiment, the small-scale protection device includes smaller versions of the ESD protection devices and/or EOS protection devices included in each of the protection chips. The small-scale protection device is connected between each pair of the protection chips or included in each protection chip to assist with protection of devices of the protection chips from damage caused by one or more EOS and/or ESD events.

In some embodiments, one of the devices connected to the display substrate is a flex cable. In one embodiment, the method includes connecting the flex cable to the protection chip and/or one or more of the other devices of the receiving display substrate through one or more of the signal lines, one or more of the power supply voltage lines, and the electrical ground line of the receiving display substrate. In one embodiment, the method includes connecting the receiving display substrate to a timing controller (TCON) and/or other devices (such as a printed circuit board, a data driver, etc) through the flex cable. In one embodiment, the method includes connecting the flex cable at a location that is at or near an edge of a contact ledge of the receiving display substrate. In one embodiment, the method includes bonding one or more of the protection chips to the receiving display substrate at a location between a display area of the receiving display substrate and an edge of a contact ledge of the receiving display substrate.

In some embodiments, the method includes providing one or more signals and one or more power supply voltages to at least one of the protection chips prior to being provided to any of the driver chips and/or any other devices of the display system to protect the driver chips and the other devices of the display system from ESD and/or EOS events. In one or more embodiment, the, signal(s) and power supply voltage(s) are provided through one or more of the signal lines, one or more of the power supply voltage lines, and the electrical ground line.

Other features and advantages are apparent from the accompanying figures and the detailed description.

BRIEF DESCRIPTION OF THE DRAWINGS

Embodiments described herein are illustrated by way of example and not limitation in the figures of the accompanying drawings, in which like references indicate similar features.

DETAILED DESCRIPTION

Figure 1A:
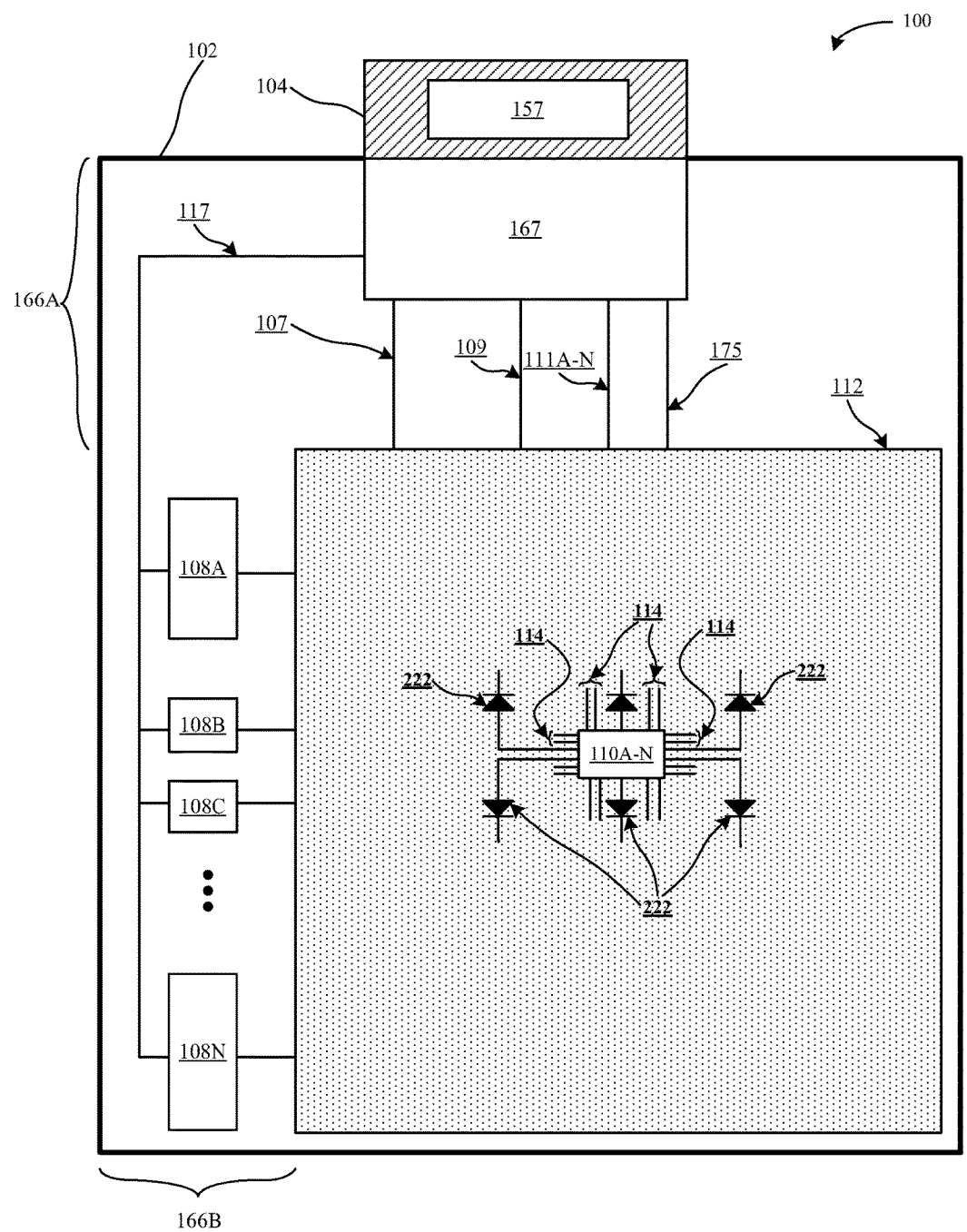
FIG. 1A is an overhead view illustration of an exemplary display system.

Embodiments describe systems and methods that assist with protecting devices of an electronic system from an electronic failure mode using one or more protection chips on a substrate of the electronic system. In one embodiment, the electronic system is a display system. In one embodiment, a display system includes a display substrate. An array of light emitting diodes (LEDs) is on the display substrate. A first driver chip is bonded to the display substrate to drive a first group of the array of LEDs. A second driver chip is bonded to the display substrate to drive a second group of the array of LEDs. In one embodiment, the protection chip is to assist with protection of the first and second driver chips, the array of LEDs, and/or other devices of the display system from an electronic failure mode. In one embodiment, the protection chip is to assist with protection of the array of LEDs, the first and second driver chips, one or more other devices on the display substrate, one or more devices connected to the display substrate, and/or the display substrate itself from damage caused by one or more EOS and/or ESD events during fabrication and subsequent use of the display system. In one embodiment, one or more signals and one or more power supply voltages are provided to the protection chip prior to being provided to the devices of the display system so as to assist with protection of the devices of the display system from one or more ESD and/or EOS events.

In one embodiment, a method of forming a display system includes bonding a plurality of protection chips to a receiving display substrate, bonding an array of driver chips to the receiving display substrate, and transferring an array of LEDs onto the receiving display substrate. Each of the array of driver chips is to drive at least one of the array of LEDs. In one embodiment, each of the plurality of protection chips includes at least one of (i) one or more electro-static discharge (ESD) protection devices or (ii) one or more electrical overstress (EOS) protection devices. In one embodiment, the ESD and/or EOS protection devices of each of the plurality of protection chips are connected between one or more signal lines of the display substrate, one or more power supply lines of the display substrate, and an electrical ground line of the display substrate. In this way, the plurality of protection chips assists with the protection of the array of LEDs, the array of driver chips, one or more other devices on the display substrate, one or more devices connected to the display substrate, and/or the display substrate itself from damage caused by one or more ESD and/or EOS events. In one embodiment, at least one of the other devices on the display substrate includes at least one of a plurality of scan drivers. In one embodiment, at least one of the devices connected to the display substrate is a flex cable.

In one embodiment, the process of picking up and transferring the plurality of protection chips, the array of driver chips, the array of LEDs, and/or one or more other devices of the display system onto the receiving display substrate is performed in one or more batches using electrostatic principles. The electrostatic charges associated with the transfer and placement processes can subject at least one of the LEDs, at least one of the driver chips, the receiving display substrate itself, at least one of the other devices on the receiving display substrate, and/or at least of the devices connected to the receiving display substrate to damage caused by one or more ESD and/or EOS events. To protect against damage caused by one or more ESD and/or EOS events, in one embodiment, a batch of protection chips is transferred onto the receiving display substrate prior to any device being transferred onto the receiving display substrate and prior to any device being connected to the receiving display substrate. In one embodiment, a batch of protection chips is transferred onto the receiving display substrate before a batch having driver chips is transferred onto the substrate, before a batch having LEDs is transferred onto the substrate, and before any other device of the display system is transferred onto the receiving display substrate. In one embodiment, a batch including protection chips and driver chips is transferred onto the receiving display substrate before one or more other devices of the display system are transferred onto the receiving display substrate. In one embodiment, a batch having protection chips and driver chips is transferred onto the receiving substrate, so that some of the protection chips and the driver chips are transferred onto the receiving display substrate at the same time. In one embodiment, a batch having LEDs is transferred onto the receiving display substrate after protection chips and driver chips have been transferred onto the receiving display substrate. Transferring the protection chips before or together with the driver chips enables the protection chips to assist with protection of the driver chips, the LEDs, the other devices on the receiving substrate and/or the receiving substrate itself from damage caused by one or more EOS and/or ESD events during fabrication of the display system. In one embodiment, picking up and transferring the devices of the display system is implemented with each device in a batch contacting the substrate simultaneously. In one embodiment, the array of driver chips and the plurality of protection chips are picked up from the same donor substrate.

In an embodiment, one or more signals and one or more power supply voltages that are meant for the driver chips, the array of LEDs, and/or the other devices of the display system on the receiving display substrate are provided to at least one of the plurality of protection chips prior to being provided to the driver chips, the array of LEDs, and/or the other devices of the display system on the receiving display substrate. In this way, at least one of the plurality of protection chips assists with protection of devices of the display system from damage caused by one or more ESD and/or EOS events.

The embodiments described herein enable provision of ESD and/or EOS protection devices for devices of display systems that may be too small to include typical ESD and/or EOS protection devices. For the sake of brevity, the description provided herein is directed to fabrication of a display system that includes a display substrate, a plurality of microcontrollers (referred to as driver chips and/or protection chips), and a plurality of LEDs. It is to be appreciated that other types of electronic systems (and the devices that comprise these electronic systems) can be protected using the embodiments described herein.

In various embodiments, description is made with reference to figures. However, certain embodiments may be practiced without one or more of these specific details, or in combination with other known methods and configurations. In the following description, numerous details are set forth, such as specific configurations, dimensions and processes, etc., to provide a thorough understanding of the embodiments. Reference throughout this specification to "one embodiment," "an embodiment" or the like means that a particular feature, structure, configuration, or characteristic described in connection with the embodiment is included in at least one embodiment. The appearances of the phrase "in one embodiment," "an embodiment" or the like in various places throughout this specification are not necessarily referring to the same embodiment. Furthermore, the particular features, structures, configurations, or characteristics may be combined in any suitable manner in one or more embodiments.

The terms "over," "to," "between," "onto," and "on" as used herein may refer to a relative position of one layer with respect to other layers. One layer "over" or "on" another layer or bonded "to" or "onto" another layer or placed "on" or "onto" another layer may be directly in contact with the other layer or may have one or more intervening layers. One layer "between" layers may be directly in contact with the layers or may have one or more intervening layers.

The term "ON" as used in this specification for a device state refers to an activated state of the device, and the term "OFF" refer to a de-activated state of the device. The term "ON" as used herein in connection with a signal received by a device refers to a signal that activates the device, and the term "OFF" used in this connection refers to a signal that de-activates the device. A device may be activated by a high voltage or a low voltage, depending on the underlying electronics implementing the device. For example, a p-channel metal-oxide-semiconductor field-effect transistor (PMOS) transistor device is activated by a low voltage while an n-channel metal-oxide-semiconductor field-effect transistor (NMOS) transistor device is activated by a high voltage. Thus, it should be understood that an "ON" voltage for a PMOS transistor device and an NMOS transistor device correspond to opposite (low vs. high) voltage levels. It is also to be understood that where $V_{DD}$ and $V_{SS}$ is illustrated or described, it can also indicate one or more $V_{DD}$ and/or $V_{SS}$. For example, a digital $V_{DD}$ for can be used for data input, digital logic, memory devices, etc., while another $V_{DD}$ is used for driving the LED output block.

In some instances, well known circuits, control signals, timing protocols, and software operations are omitted or not shown in detail to avoid obscuring the embodiments described herein.

As used herein, a "microcontroller" is a computer system on a single integrated circuit (IC) that is designed to have a dedicated function within a larger electronic system.

As used herein, "a driver chip" or its variations refer to a microcontroller that is configured to switch and/or drive one or more light emitting devices (e.g., one or more LEDs) of a display system. The driver chip can be used to maintain precise brightness, uniformity, and/or color control over the light produced by the light emitting devices of the display system.

As used herein, a "protection chip" or its variations refer to a microcontroller that is configured to assist in protection of one or more devices of an electronic system against damage caused by one or more ESD and/or EOS events that occur during fabrication of the electronic system, during connection of the electronic system to other devices of the electronic system, during connection of the electronic system to other electronic systems, and/or during subsequent shipping, handling, maintenance, and operation of the electronic system.

As used herein, "an EOS event" or its variations refer to the exposure of an electrical device of an electronic system to a current or voltage beyond the device's maximum ratings. This exposure may or may not result in a failure of the device, but it can cause thermally-induced failures of the device, electromigration-related failures of the device, or electric field-related failures of the device. EOS events include an ESD event, latch-up, power-up/power-down transients, and excessive direct current (DC) current/voltage levels. Common damage to electrical devices resulting from EOS events includes junction spiking failure, melted metallization failure, and open bond wires failure.

As used herein, "an ESD event" or its variations refer to a rapid, spontaneous transfer of electrostatic charge to an electrical device of an electronic system that is induced by a high electrostatic field. ESD events are the most common forms of EOS events. The high electrostatic field is caused by two bodies at different potentials, i.e., two bodies with different levels of charges. Some well-known forms of damage caused by ESD events include gate oxide breakdown, junction spiking failure, and latch up failure. ESD events are undesirable because they can cause immediate device failure, permanent parameter shifts, and latent damage that causes an increased degradation rate. ESD events, when compared with EOS events, generally have higher currents, higher voltages, and occur over a shorter time span. As a result, ESD events tend to have lower energies and occur more rapidly than EOS events. Even though ESD events tend to occur more rapidly than EOS events, the higher energy levels associated with EOS events tends to cause a higher level of damage to electronic devices than the damage caused by the lower energy ESD events. Protection against ESD and EOS events is important because the differing extents of damage caused by the two types of events.

As used herein, "protection against ESD events and/or EOS events" or its variations refer to two stages of protection—a primary protection stage and a secondary protection stage. Devices used in the primary protection stage (primary protection elements) are usually placed closer to the source of the ESD and/or EOS events to form the main energy dissipation path. The secondary protection devices are placed near sensitive electrical devices to prevent (or clamp) the voltage spike from causing damages.

FIG. 1A is an overhead view illustration of an exemplary display system 100. The exemplary display system 100 includes a receiving display substrate 102, a flex cable 104, at least one data driver 157A-N mounted on the flex cable 104, one or more connector pins 167, a plurality of scan drivers 108A-N, an array of driver chips 110A-N, an array of LEDs 222, contact ledges 166A-B, and distribution lines 107, 109, 111A-N, 117A-N, and 175. It is to be appreciated that display system 100 can include other devices on substrate 102 and that the system 100 can include other devices connected to substrate 102. For the sake of brevity, many of these devices are not shown in FIG. 1A.

The receiving display substrate 102 includes a display area 112, contact ledges 166A-B, the connector pin(s) 167, and the distribution lines 107, 109, 111A-N, 117A-N, and 175 to transmit signals and power voltages provided by connector pin(s) 167.

In one embodiment, the display area 112 is an area where the light produced by LEDs 222 is displayed. The driver chips 110A-N and the LEDs 222 are located in the display area 112. In one embodiment, the contact ledges 116A-B are a peripheral area surrounding the display area 112. Devices of system 100 (e.g., the connector pins 167, and the scan drivers 108A-N, etc) are located on the contact ledges 116A-B.

In one embodiment, the connector pin(s) 167 provide one or more signals and/or power voltages via the distribution lines 107, 109, 111A-N, 117A-N, and 175 to the devices of system 100. In one embodiment, a plurality of power supply voltage lines 107 provide at least one voltage ($V_{DD}$) from one or more power supplies (not shown) to the devices of system 100. In one embodiment, ground line 109 provides the electrical ground ($V_{SS}$) to the devices of system 100. In one embodiment, a plurality of data lines 111A-N provide input signals ($D_1$ to $D_N$) to be processed by driver chips 110A-N into one or more display driver signals. In one embodiment, a reference voltage line 175 provides a reference voltage ($V_{Ref}$) for one or more functions of driver chips 110A-N. In one embodiment, a plurality of scan driver lines 117A-N enables communication between the scan drivers 108A-N, the data driver 167, the array of LEDs 112, and/or the array of driver chips 110A-N. In one embodiment, metal traces 114 are used for interconnection of the distribution lines 107, 109, 111A-N, 117A-N, and 175 to the array of LEDs 222, the array of driver chips 110A-N, flex cable 104, and/or the other devices of the system 100.

In one embodiment, display system 100 includes a flex cable 104 that is connected to the connector pin(s) 167 of substrate 102 through the distribution lines 107, 109, 111A-N, 117A-N, or 175. In one embodiment, the receiving display substrate 102 is connected to a timing controller (TCON) (not shown) through the flex cable 104. In one embodiment, the flex cable 104 is connected to the substrate 102 after the array of LEDs 222, the array of driver chips 110A-N, the scan drivers 108A-N, and/or the distribution lines 107, 109, 111A-N, 117A-N, and 175 are on the substrate 102. In one embodiment, the flex cable 104 is located between the display region 112 and an edge of the contact ledge 166A of the receiving display substrate 102.

In one embodiment, at least one data driver 157A-N is mounted on flex cable 104 and connected to display substrate 102 to provide display driver signals to the driver chips 110A-N via data lines 111A-N. Each data drivers 157A-N can be an IC that processes one or more input signals provided through data lines 111A-N into display driver signals for driver chips 110A-N.

In one embodiment, scan drivers 108A-N are on substrate 102 between an edge of contact ledge 166B and display area 112. Each scan driver 108A-N is connected to display substrate 102 to provide one or more selection signals for selection of driver chips 110A-N. For example, scan drivers 108A and 108B sequentially apply a selection signal to the scan driver lines 117A-B to select first and second groups of driver chips 110A-N, respectively, to receive one or more driver signals that trigger a driving of a first and second group of LEDs 222, respectively.

In one embodiment, additional devices (not shown) are located off of the display substrate 102 on a printed circuit board (not shown) that is connected to the flex cable 104. Devices located off of the display substrate 102 can include power supplies, driver integrated circuits (ICs), such as a data driver and a scan driver, power management ICs, processors, timing controllers, touch sense ICs, wireless controllers, communications ICs, etc. For example, a power supply (not shown) may be mounted on a printed circuit board (not shown) such that the printed circuit board is electrically connected to the flex cable 104 on which the data driver(s) 157A-N are mounted. In this example, the power supply supplies a system voltage ($V_{DD1}$) to one or more of the power supply voltage lines 107 through the flex cable 104 to provide a common voltage to power the devices of system 100. In a further example, the power supply provides a driver voltage ($V_{DD2}$) to the scan drivers 108A-N and the data driver(s) 157A-N. In an even further example, the printed circuit board, on which the power supply is mounted, includes one or more interconnections provided to provide $V_{DD1}$ and $V_{DD2}$ to the flex cable 104, which uses the lines 107 to provide them to the respective devices of system 100.

In one embodiment, at least one of the connector pin(s) 167, the plurality of scan drivers 108A-N, the array of driver chips 110A-N, the array of LEDs 222, or other devices (not shown) are bonded to the receiving display substrate 102. The bonds between the devices of system 100 and substrate 102 can be made using various connections such as, but not limited to, conductive pads, conductive bumps, conductive balls, and other bonds known in the art. The bonds can be made from any suitable metallic or other types of suitable material known in the art. The bonding methods that may be used include, but are not limited to, thermocompression bonding, thermal bonding, and thermosonic bonding.

In one embodiment, display system 100 includes at least one micro device. In one embodiment, the array of LEDs 222 includes at least one micro LED that is an inorganic semiconductor-based LED. In one embodiment, the array of driver chips 110A-N includes at least one micro driver chip.

The terms "micro" device, "micro" LED, "micro" driver chip, and "micro" protection chip, as used herein, refer to the descriptive size of certain devices or structures in accordance with the embodiments. As used herein, the terms "micro" devices or structures refer to the scale of one µm to 300 µm. Embodiments described herein, however, are not limited to the scale of one µm and 300 µm, and certain aspects of the embodiments described herein apply to larger or smaller size scales. In one embodiment, a single micro LED in an array of LEDs on the receiving display substrate 102 has maximum dimensions that range from one µm to 300 µm. For example, a maximum length and/or width of the single micro LED ranges from one µm to 300 µm. In one embodiment, the top contact surface of a single micro LED in an array of LEDs on the receiving display substrate 102 has a maximum dimension that ranges from one µm to 300 µm, or more specifically from 3 µm to 20 µm. In one embodiment, a single micro driver chip in an array of driver chips 110A-N that is on the receiving display substrate 102 has maximum dimensions that range from one µm to 300 µm. For example, a maximum length and/or width of the single micro driver chip ranges from one µm to 300 µm.

As LEDs, driver chips, and other devices of display systems are advancing into the micro device regime, the risk of damage caused by ESD and/or EOS events to these devices is a growing concern as the circuitry of these devices becomes increasingly sensitive to fluctuations in current or voltage. In display systems having micro devices, placement of currently-available ESD and/or EOS devices within the micro devices may not be feasible given that typical ESD and/or EOS devices are larger than most of the micro devices. For example, a currently-available ESD protection device includes a transient-voltage-suppression (TVS) diode and has a length that ranges from 1.45 mm to 1.75 mm and a width that ranges from 0.65 mm to 0.95 mm. In a display system, such as the system 100 illustrated in FIGS. 1A-1C, that may be composed of micro devices, such a large ESD protection device would be too large to be included in the display area of the display system. This is because, in one embodiment, system 100 has a predetermined resolution, a predetermined pixel density, and/or a predetermined subpixel density that restricts the sizes of devices that can be included in system 100. For example, system 100 is a display system with a 40 PPI (pixels per inch) and 210 µm subpixel pitch. In this example, driver chips 110A-N and the LEDs 222 that make up the system 100 would have to be small enough to fit between the subpixels, i.e., the driver chips 110A-N and the LEDs 222 would have to be micro devices that are smaller than 210 µm. In another example, system 100 is a display system with a 440 PPI (pixels per inch) and 19 µm subpixel pitch. In this example, driver chips 110A-N and the LEDs 222 that make up the system 100 would have to be small enough to fit between the subpixels, i.e., the driver chips 110A-N and the LEDs 222 would have to be micro devices that are smaller than 19 µm. As illustrated in the preceding examples, protection against ESD and/or EOS events can be important for a display system 100 that has micro devices, given that the micro devices may not include ESD and/or EOS protection devices due to the predetermined resolution, the predetermined pixel density, and/or a predetermined subpixel density of the display system 100. In one embodiment, the protection chips described below in connection with FIGS. 2A-5B assist with protection against damage caused by ESD and/or EOS events in a display system 100 that includes at least one micro device. In one embodiment, a distributed ESD and/or EOS protection scheme made up of a plurality of ESD and/or EOS protection devices that are each in the scale of micrometers fits inside multiple protection chips described below in connection with FIGS. 2A-5B. In this embodiment, each of the multiple protection chips is in the scale of micrometers. In this way, the distributed ESD and/or EOS protection devices are designed to work in parallel to provide protection for the entire panel. When ESD and/or EOS events occur at the panel level, the protection provided by the distributed ESD and/or EOS protection scheme can be identical to or even superior to the protection provided by currently-available ESD and/or EOS circuits known in the art. For example, a distributed ESD protection scheme comprised of multiple protection chips, as described herein, provides protection against damage caused by an ESD event that is at least equal to the ESD protection provided by one or more currently-available TVS diodes. In one embodiment, smaller versions of the ESD and/or EOS protection devices inside the protection chips described below in connection with FIGS. 2A-5B fit inside one or more display drivers to provide added protection against ESD and/or EOS events. It is to be appreciated that the protection chips described below in connection with FIGS. 2A-5B can protect other types of electronic systems (that may or may not include micro devices), as well as display systems that do not include micro devices. It is to be appreciated that the display system 100 can include micro devices or have no micro devices at all. For example, the display system 100 includes at least one organic LED (OLED).

Fabrication of the display system 100 can include transferring the array of LEDs 222, the array of driver chips 110A-N, and one or more other devices (e.g., a scan driver, etc.) onto the receiving display substrate 102 (e.g., a silicon substrate etc.) by transfer head assemblies that operate using electrostatic principles. In one embodiment, the array of driver chips 110A-N is transferred onto substrate 102 before the array of LEDs 222 is transferred onto substrate 102. The array of driver chips 110A-N is connected to one or more of the array of LEDs 222 through traces 114. For the sake of brevity, one driver chip is used to represent the array of driver chips 110A-N in FIG. 1A and six LEDs are used to represent the array of LEDs 222 in FIG. 1A. Some of the connections between metal traces 114, distribution lines 107, 109, 111A-N, and 175 from connector pin(s) 167, the array of LEDs 222, the array of driver chips 110A-N, and the other devices of system 100 are omitted so as not to complicate the description provided.

In one embodiment, the picking up and transferring of the array of LEDs 222 and the array of driver chips 110A-N is done in one or more batches using electrostatic principles. In a further embodiment, the batches including the driver chips 110A-N are transferred onto substrate 102 before the batches including LEDs 222 are transferred onto the substrate 102. Electrostatic transfer enables the arrays of the LEDs 222 and arrays of the driver chips 110A-N to be placed on the same side of the receiving display substrate 102. In one embodiment, picking up and transferring the array of a batch of devices onto substrate 102 is implemented with each device in a batch contacting the substrate simultaneously. In this embodiment, however, electrostatic charges associated with the transfer and placement processes can subject the array of LEDs 222, the array of driver chips 110A-N, one or more other devices of system 100, metal traces 114, dielectric material between metal traces 114 on substrate 102, and/or the receiving display substrate 102 itself to risks of damage caused by one or more ESD and/or EOS events. For example, ESD and/or EOS events occur as soon as the placement of one or more of the array of LEDs 222 and/or, one or more of the array of driver chips 110A-N on the receiving display substrate 102 occurs. Additionally, as one or more of the array of LEDs 222, the array of driver chips 110A-N, and/or other devices of display system 100 are placed on the metal traces 114 of the substrate 102, charges of these devices may accumulate on the metal traces 114 and raise the voltage level of the metal traces 114 of the substrate 102. The raised voltage level of the metal traces 114 can produce one or more EOS and/or ESD events that cause damage to the array of LEDs 222, the array of driver chips 110A-N, the other devices on the receiving display substrate 102, and/or the receiving display substrate 102 itself when a differential voltage between the metal traces 114 reaches a critical level. During the fabrication and subsequent use of a display system, such as display system 100, damage to the devices of the display system caused by ESD and/or EOS events can cause some of the devices (e.g., the driver chips 110A-N and/or the LEDs 222) in the system to malfunction or not function. This can create a dead spot in the display system that causes suboptimal operation of the display system. In one embodiment, the protection chips described below in connection with FIGS. 2A-5B assist in protection against damage from ESD and/or EOS events that occur because of activities performed during and after fabrication of the display system 100.

Figure 1B:
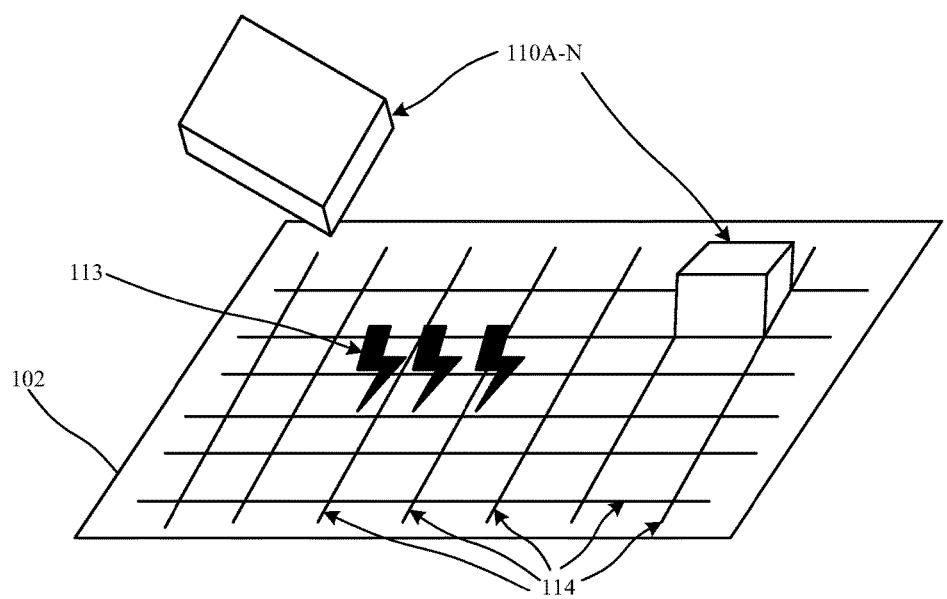
FIGS. 1B-1C are illustrations of two exemplary situations in which ESD and/or EOS events that occur during fabrication of the exemplary display system of FIG. 1A cause damage to one or more devices of the exemplary display system of FIG. 1A.

FIG. 1B illustrates an example of a situation that results in damage to one or more devices of the display system 100 during an electrostatic transfer of a plurality of devices (e.g., driver chips 110A-N) from a donor substrate to the receiving display substrate 102 of display system 100. Voltage can build up due to placement (or bonding) of devices (e.g., driver chips 110A-N) onto the substrate 102 during the fabrication of system 100. For example, as multiple driver chips 110A-N are placed on substrate 102, charges of each driver chip 110A-N accumulate on the metal traces 114. In this example, the accumulation of charges results in a gradual build-up of a voltage on metal traces 114. The raised voltage level in this example causes one or more EOS and/or ESD events 113 that result in damage to one or more driver chips 110A-N, one or more other devices on substrate 102, metal traces 114, dielectric material between metal traces 114 on substrate 102, and/or the substrate 102 itself. In a further example, the gradually increasing voltage on the metal traces 114 causes a differential voltage between metal traces 114. In this further example, when the differential voltage reaches a critical level, an EOS event occurs that causes damage to one or more driver chips 110A-N that are on substrate 102. In another example, when the differential voltage reaches a critical level, an ESD event occurs that causes damage to one or more driver chips 110A-N that will subsequently be placed on substrate 102 (e.g., driver chips 110A-N in the next batch of transferred driver chips 110A-N).

As shown in the preceding examples, one or more EOS and/or ESD event(s) 113 can cause damage to one or more devices of system 100 (e.g., driver chips 110A-N) that are already on substrate 102, and/or to one or more devices of system 100 (e.g., driver chips 110A-N) that are being placed onto substrate 102 during fabrication of the display system 100. FIG. 1B is described in connection with damage to one of more of driver chips 110A-N, however, damage can also occur to one or more of the LEDs 222, and/or one or more of the other devices of system 100 that are on the receiving display substrate 102. In one embodiment, the protection chips described below in connection with FIGS. 2A-5B assist in protection against damage that can result from one or more ESD and/or EOS events that occur because of rapid or gradual increases in the voltage of metal traces 114 of substrate 102 during fabrication of the display system 100.

During the connecting of flex cable 104 to the receiving display substrate 102, damaging ESD and/or EOS events can occur because of charge or voltage differentials that are present when the flex cable 104 contacts with the receiving display substrate 102.

Figure 1C:
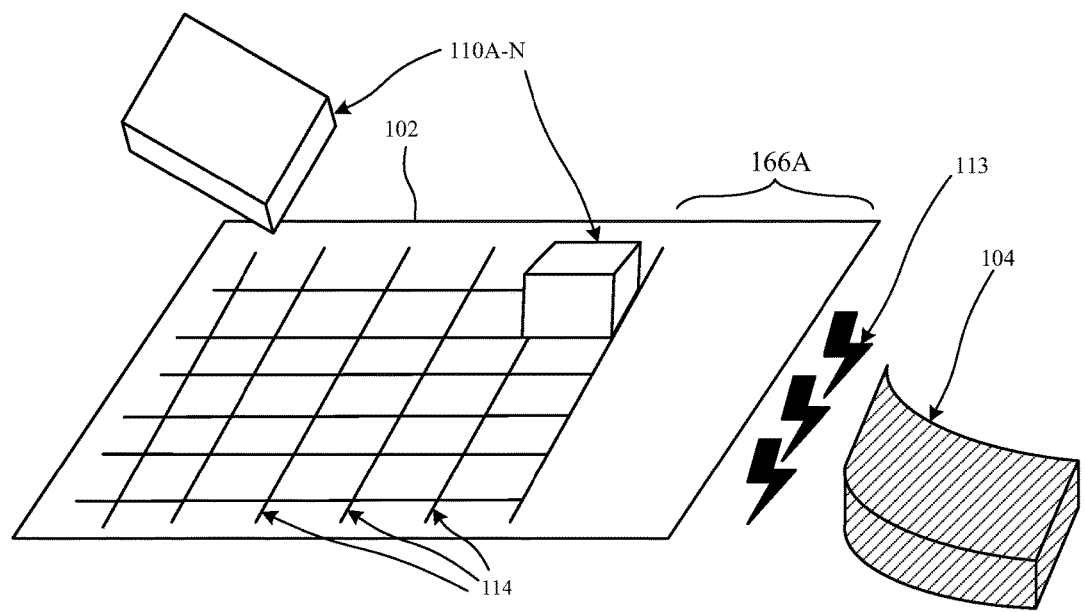

FIG. 1C illustrates an example of a situation that results in damage to one or more devices of the display system 100 during connection of a flex cable 104 to the receiving display substrate 102 of display system 100. One or more ESD and/or EOS events 113 occur following contacting of the flex cable 104 with the receiving display substrate 102. The contacting can occur through actual contact between the flex cable 104 and the edge of the contact ledge 166A or through distribution lines from connector pin(s) 167 or other types of devices known in the art that connect the flex cable 104 to the substrate 102. The ESD and/or EOS event(s) 113 can cause damage to at least one of the devices of display system 100 (e.g., one or more of driver chips 110A-N that are on display substrate 102). FIG. 1C is described with damage to one of more of driver chips 110A-N, however, damage can occur to the metal traces 114, dielectric material between metal traces 114 on substrate 102, the substrate 102 itself, the array of LEDs 222, and/or other devices that are on the substrate 102. In one embodiment, the protection chips described below in connection with FIGS. 2A-5B assist in protection against damage from ESD and/or EOS events that occur from a connection of the flex cable 104 to the substrate 102.

Even after the fabrication of the display system 100 is completed, the array of LEDs 222, the array of driver chips 110A-N, the other devices on the receiving display substrate 102, one or more devices connected to receiving display substrate 102, metal traces 114, dielectric material between metal traces 114 on substrate 102, and/or the receiving display substrate 102 itself can be damaged by ESD and/or EOS events that occur during shipping, receiving, field handling, maintenance, consumer use, etc. In one embodiment, the protection chips described below in connection with FIGS. 2A-5B assist in protection against damage from ESD and/or EOS events that occur because of activities performed after fabrication of the display system 100.

Figure 2A:
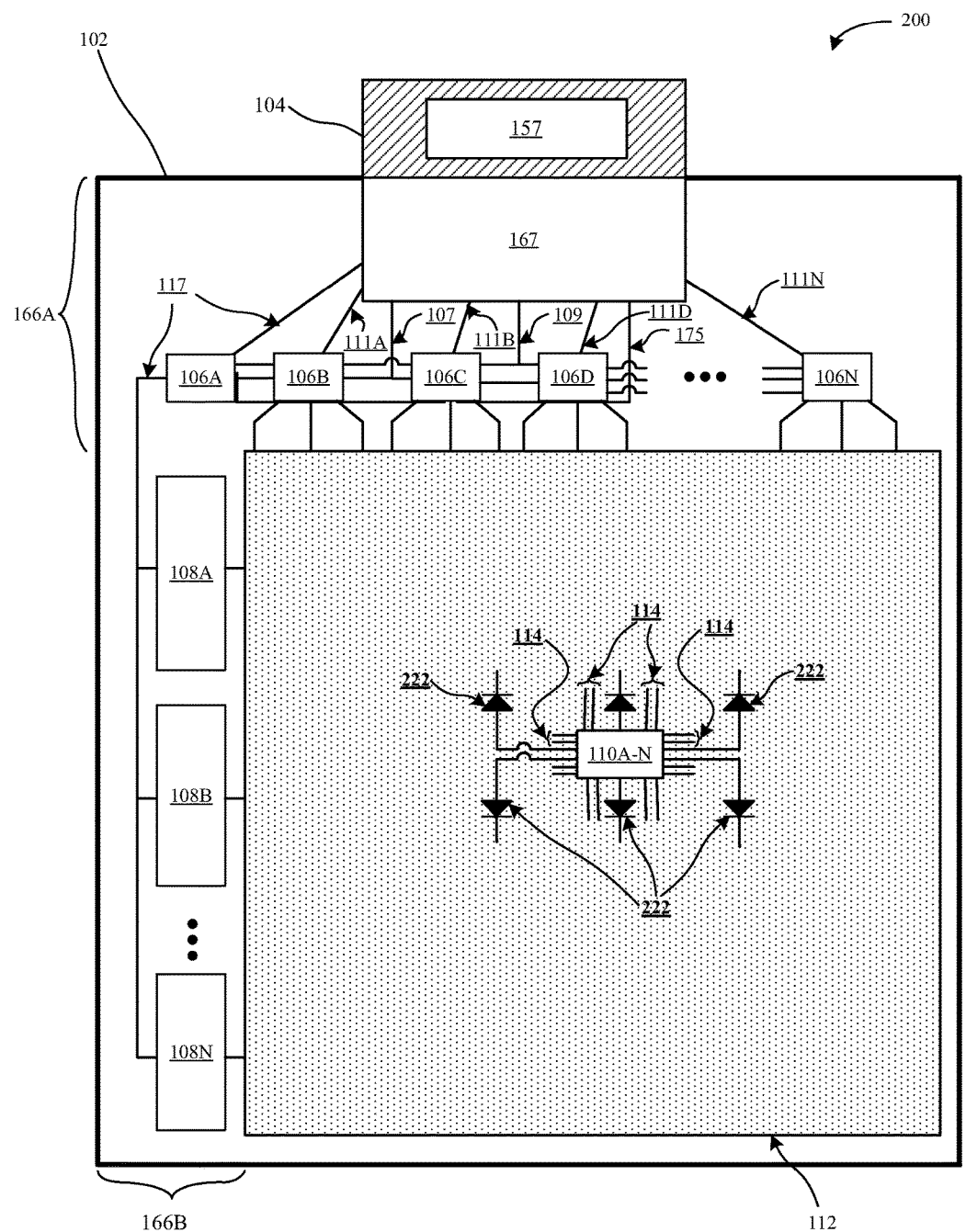
FIG. 2A is an overhead view illustration of a display system, e.g., the exemplary display system of FIG. 1A, that includes protection against damage caused by ESD and/or EOS events in accordance with one embodiment.

FIG. 2A is an overhead view illustration of a display system 200 that includes protection against damage caused by ESD and/or EOS events in accordance with one embodiment. Display system 200 of FIG. 2A is a modification of display system 100 of FIGS. 1A-1C. In contrast to system 100 of FIGS. 1A-1C, display system 200 includes a plurality of protection chips 106A-N on substrate 102 between an edge of contact ledge 166A and the display area 112. In one embodiment, each of the protection chips 106A-N is a microcontroller configured to assist with protection of the LEDs 222, the driver chips 110A-N, the scan drivers 108A-N, the connector pin(s) 167, the data driver(s) 157A-N, the flex cable 104, one or more other devices of system 200, or the substrate 102 itself from damage caused by one or more ESD and/or EOS events. In one embodiment, the protection chips 106A-N are connected to the devices of display system 100 through at least one of the distribution lines from connector pin(s) 167. For example, three protection chips 106 A-C are connected to each of scan drivers 108A, 108B, and 108N through one or more signal lines 117A-N, power supply voltage lines 107, and electrical ground line 109.

Figure 2B:
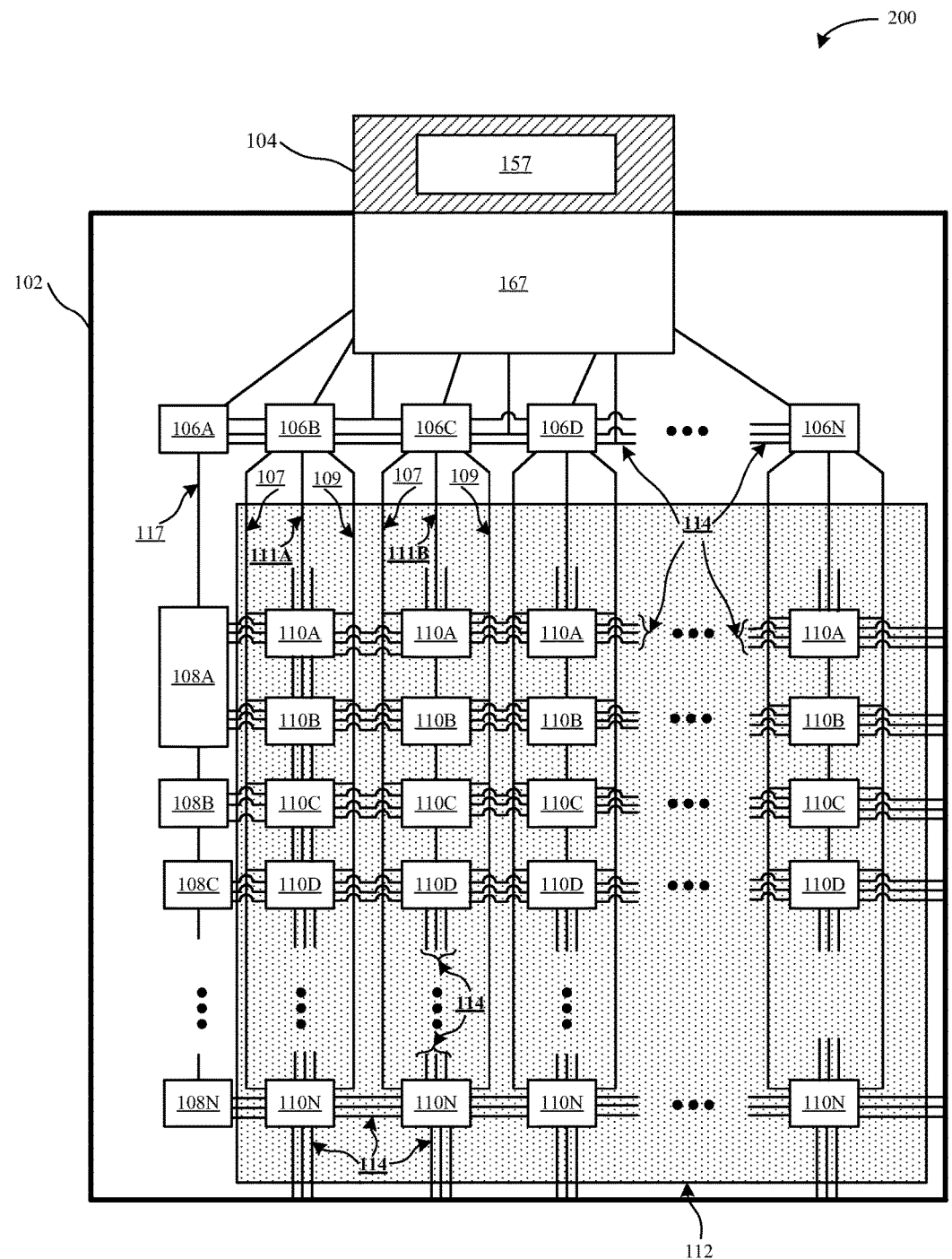
FIG. 2B is a detailed overhead view illustration of the display system of FIG. 2A in accordance with an embodiment.

FIG. 2B is a detailed overhead view illustration of the display system 200 of FIG. 2A in accordance with an embodiment. An array of driver chips 110A-N is on the display region 112 of the receiving display substrate 102. In one embodiment, the array of LEDs 222 (not shown in FIG. 2B) is also on the display area 112. In one embodiment, each of the driver chips 110A-N is a microcontroller configured to switch and/or drive one or more of LEDs 222 on display area 112.

In one embodiment, the protection chips 106A-N are transferred onto substrate 102 before any other devices of display system 200 are transferred onto substrate 102. In one embodiment, the array of LEDs 222 is transferred onto the substrate 102 after the array of driver chips 110A-N and the array of protection chips 106A-N are transferred onto display region 112. This is because the LEDs have, in one embodiment, larger heights than the driver chips. In one embodiment, the array of protection chips 106A-N is transferred onto the display substrate 102 before the array of LEDs 222 and before the array of driver chips 110A-N are transferred onto substrate 102. In one embodiment, the protection chips 106A-N are transferred onto the substrate 102 before the scan drivers 108A-N, before the array of LEDs 222, and before the array of driver chips 110A-N are transferred onto substrate 102. This is to provide protection against damage caused by ESD and/or EOS events to the driver chips 110A-N, the LEDs 222, the scan drivers 108A-N, and/or the other devices on substrate 102 that may result from a voltage buildup as the driver chips 110A-N, the LEDs 222, the scan drivers 108A-N, and/or other devices are transferred onto substrate 102. In one embodiment, the array of protection chips 106A-N and the array of driver chips 110A-N are transferred onto the display substrate 102 at the same time and prior to the array of LEDs 222 being transferred onto substrate 102. In one embodiment, the LEDs 222, the driver chips 110A-N and/or the protection chips 106A-N are picked up from one or more donor substrates in batches using electrostatic transfer heads that operate based on electrostatic transfer principles. In one embodiment, the plurality of driver chips 110A-N and the plurality of protection chips 106A-N are transferred in batches from the same donor substrate to the receiving display substrate 102. In one embodiment, the driver chips 110A-N and the protection chips 106A-N are transferred in batches at the same time. For example, electrostatic transfer heads pick up a batch comprising protection chips 106A-N and driver chips 110A-N from one donor substrate and place the batch onto the receiving display substrate 102. In this example, the batch is on the receiving display substrate 102 before the LEDs 222 are on substrate 102.

Each of the protection chips 106A-B can be arranged on the receiving substrate 102 to provide EOS protection and/or ESD protection for a group of devices of display system 200, e.g., a column of driver chips 110A-N. In one embodiment, each of the protection chips 106A-N includes one or more ESD protection devices to protect the group of devices of display system 200 from damage caused by an ESD event. The one or more ESD protection devices can be formed using at least one of a thyristor, a varistor, a polymer ESD device, a gas discharge tube, a gate-grounded Metal-Oxide-Semiconductor Field-Effect Transistor (MOSFET), a gate-coupled MOSFET, a silicon controlled rectifier (SCR), a medium voltage triggered SCR, or any other electronic device known to deal with rapid ESD events. In one embodiment, each of the protection chips 106A-N includes one or more EOS protection devices to protect the group of devices of display system 200 from damage caused by an ESD event. The one or more EOS protection devices can be formed using a thyristor, a diode string comprising a plurality of P-N junctions that are connected in series, a bidirectional or unidirectional diode-based Transient Voltage Suppressor (TVS), or any other electronic device known to deal with slow EOS events.

In one embodiment, at least one of the ESD and/or EOS protection devices exhibits a snapback trait. This trait provides a predetermined trigger condition, which when exceeded, causes the corresponding protection device to enter into a low-impedance state that is held until a predetermined hold condition is no longer present. The snapback trait can be achieved by including a clamp device in at least one of the ESD or the EOS protection devices to clamp a voltage at a predetermined voltage when a trigger voltage is exceeded. In one embodiment, ESD and/or EOS protection is implemented by intentionally designed and calculated leakage through standard circuits that occurs during ESD and/or EOS events.

The choice of the type of ESD protection device and/or EOS protection device of protection chips 106A-N depends, at least, on the external stress that the devices of display system 200 (e.g., driver chips 110A-N) will be subjected to. In one embodiment, the external stress that is or will be experienced by the devices of display system 200 (e.g., driver chips 110A-N) is defined by at least one of the stress definitions in industry standard tests for system sturdiness to electrical stress. These standards include protection standards developed by Underwriters Laboratories (UL), the Institute of Electrical and Electronics Engineers (IEEE), and the International Electrotechnical Commission (IEC). For example, the definition of the electrical stress that is or will be experienced by the devices of display system 200 (e.g., driver chips 110A-N) is based on the quality and reliability standards of solid-state products, regulated by JEDEC committee JC-14. In one embodiment, at least one of the Human Body Model (HBM), the Charged Device Model (CDM), the Machine Model (MM), ESD immunity test as defined in IEC 61000-4-2, or the Lightning and industrial surges test defined by IEC 61000-4-5 is used to classify the electrical stress that is or will be experienced by the devices of display system 200 (e.g., driver chips 110A-N).

In one embodiment, the ESD and/or EOS protection devices of at least one of protection chips 106A-N are connected to each other in parallel between the $V_{DD}$ (lines 107), $V_{SS}$ (line 109), and one or more of the other distribution lines from connector pin(s) 167. In this way, the devices of display system 200 (e.g., driver chips 110A-N) are protected from both rapid ESD events and slow EOS events. In a further embodiment, power voltages and signals provided by $V_{DD}$ (lines 107), $V_{SS}$ (line 109), lines 175, lines 111A-N, and lines 117A-N are not applied to the devices of display system 200 (e.g., driver chips 110A-N) without passing through the respective protection chips 106A-N. In this way, the driver chips 110A-N, the data drivers 157A-N, the scan drivers 108A-N, and/or the other devices of display system 200 are protected from signals and voltages that cause ESD and/or EOS events.

In one embodiment, multiple protection chips 106A-N work in parallel to protect the devices of display system 200 (e.g., driver chips 110A-N) from damage caused by one or more ESD and/or EOS events. In one embodiment, the multiple protection chips 106A-N working in parallel scale up their level of protection against damage caused by ESD and/or EOS events as the number of the protection chips 106A-N that are connected in parallel increases. In one embodiment, the triggering signal is generated in response to at least one of the protection chips 106A-N being triggered by one or more ESD and/or EOS events. In one embodiment, the triggering signal is internally generated by the at least one protection chip 106A-N that is triggered by the one or more ESD and/or EOS events. In one embodiment, the internally generated triggering signal is provided by the triggered protection chip, via one or more signal lines between all the protection chips 106A-N, to each of the other protection chips 106A-N. In this way, the multiple protection chips 106A-N are triggered simultaneously to work together to scale up protection against ESD and/or EOS events in proportion with their numbers. In one embodiment, the internally generated triggering signal is used to simultaneously turn on all of the ESD and/or EOS protection devices within the multiple protection devices 106A-N. An exemplary internally generated triggering signal is described below in connection with FIG. 2C. In one embodiment, at least one of the signals from connector pins 167 (not shown) is used as an externally generated triggering signal for multiple protection chips 106A-N that turns on the ESD and/or EOS protection devices within these protection chips 106A-N simultaneously when one or more ESD and/or EOS events occur. In this way, the triggering signal can be generated externally and provided to the chips 110A-N using connector pins 167.

In one embodiment, one or more of the protection chip(s) 106A-N are micro protection chips. As a result, the ESD and/or EOS protection devices in the micro protection chips are limited in size to the micro-meter range.

In one embodiment, the protection chips 106A-C assist with protection against damage caused by one or more ESD and/or EOS events in a display system that includes at least one micro device, e.g., display system 200. It is to be appreciated that the protection chips 106A-C can protect other types of electronic systems (that may or may not include micro devices), as well as display systems that do not include micro devices. It is to be appreciated that the display system 200 can include micro devices or have no micro devices at all. For example, the display system 200 includes at least one organic LED (OLED).

In one embodiment, scan drivers 108A-N are connected to at least one of the protection chips 106A-N, which assist in protecting the scan drivers 108A-N from damage resulting from ESD and/or EOS events. For example and as shown in FIG. 2B, a first driver chip 110A, a second driver chip 110B, and a third driver chip 110C are arranged as a first column on the receiving substrate 102. In this example, the first driver chip 110A and a fourth driver chip 110A are arranged as a first row on the receiving substrate 102. In this example, the fourth driver chip 110A is arranged as a second column on the receiving substrate 102, the second driver chip 110B is arranged as a second row on the receiving substrate, and the third driver chip is arranged as third row on the receiving substrate. In this example, a first one of data drivers 157A-N is to provide a first display driver signal to the driver chips 110A-C in the first column while a second one of the data driver(s) 157A-N is to provide a second display driver signal to the driver chip 110A in the second column. In this example, the second display driver signal can be the same as or different from the first display driver signal. Furthermore, in this example, a first scan driver 108A is to select at least one of the first row or the second row and a second scan driver 108B is to select the third row. In this example, the first and second data driver(s) 167 provide the respective driver signals to the respective driver chips 110A-C when the respective driver chips 110A-C are in the selected row. In this example, each of the scan drivers 108A-B are connected to one of three protection chips 106A-C via the $V_{DD}$ (lines 107), the $V_{SS}$ (line 109), and the lines 117A-N. Hence, additional ESD and/or EOS protection is provided to the display system 200 of FIG. 2B. In the illustrated example of FIG. 2B, the three protection chips 106A-C are schematically represented using a single block for the sake of brevity. It is to be appreciated that, in one embodiment, each of protection chips 106A-C shown in FIG. 2B is embodied on a single microprocessor chip.

Figure 7:
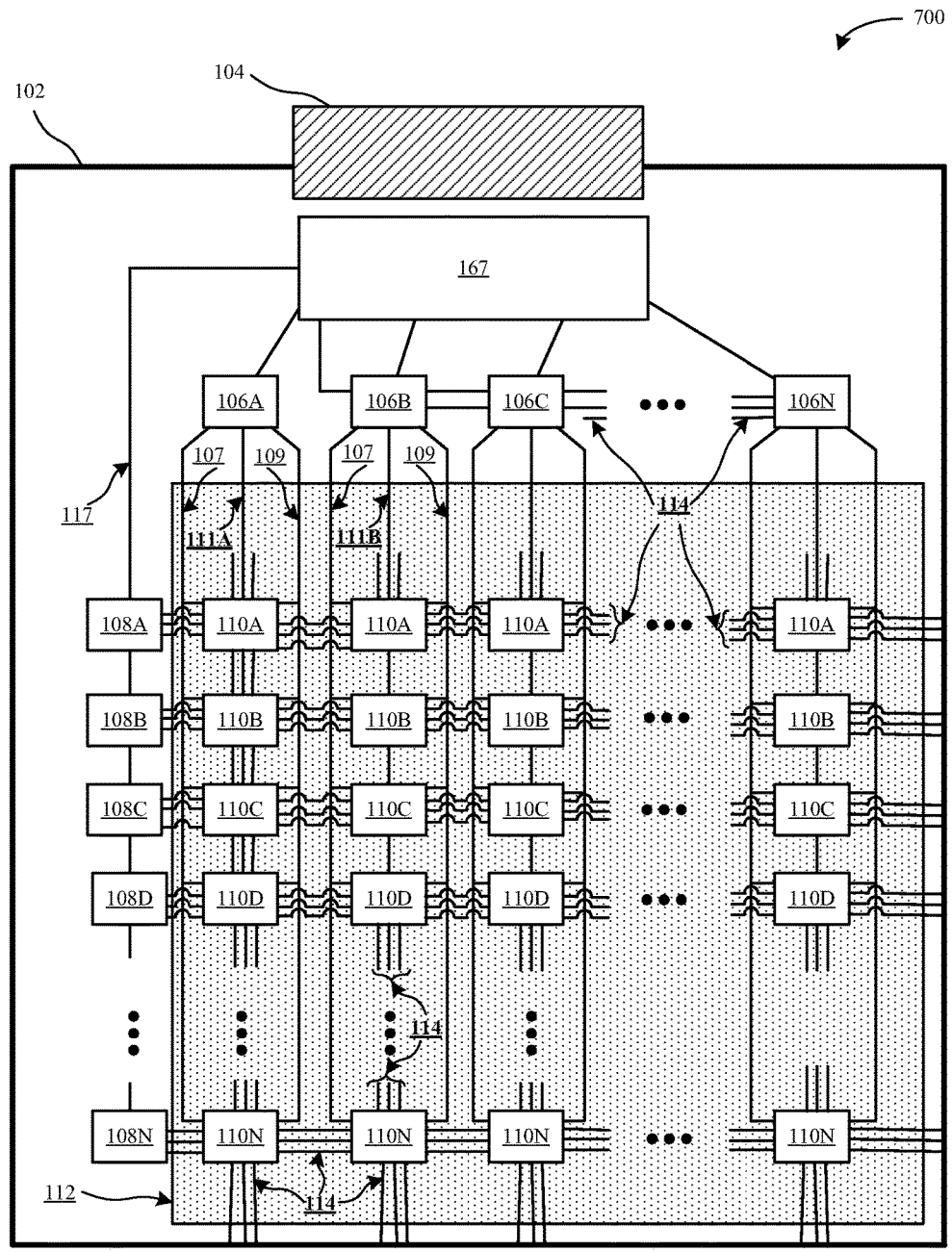
FIG. 7 is a detailed overhead view illustration of a display system that includes protection against damage caused by ESD and/or EOS events in accordance with another embodiment.

Referring briefly to FIG. 7, which is a detailed overhead view illustration of a display system 700 that includes protection against damage caused by ESD and/or EOS events in accordance with another embodiment. Display system 700 is a modification of display system 200 of FIG. 2B. In contrast to display system 200 of FIG. 2B, the scan drivers 108A-N of display system 700 are not connected to one or more of the protection chips 106A-N. In the illustrated embodiment of system 700, the scan drivers are directly connected to the data driver 167 and the respective rows of driver chips 110A-N. This embodiment could assist with reducing the number of protection chips placed on substrate 102, which could be helpful in size-critical systems.

Figure 2C:
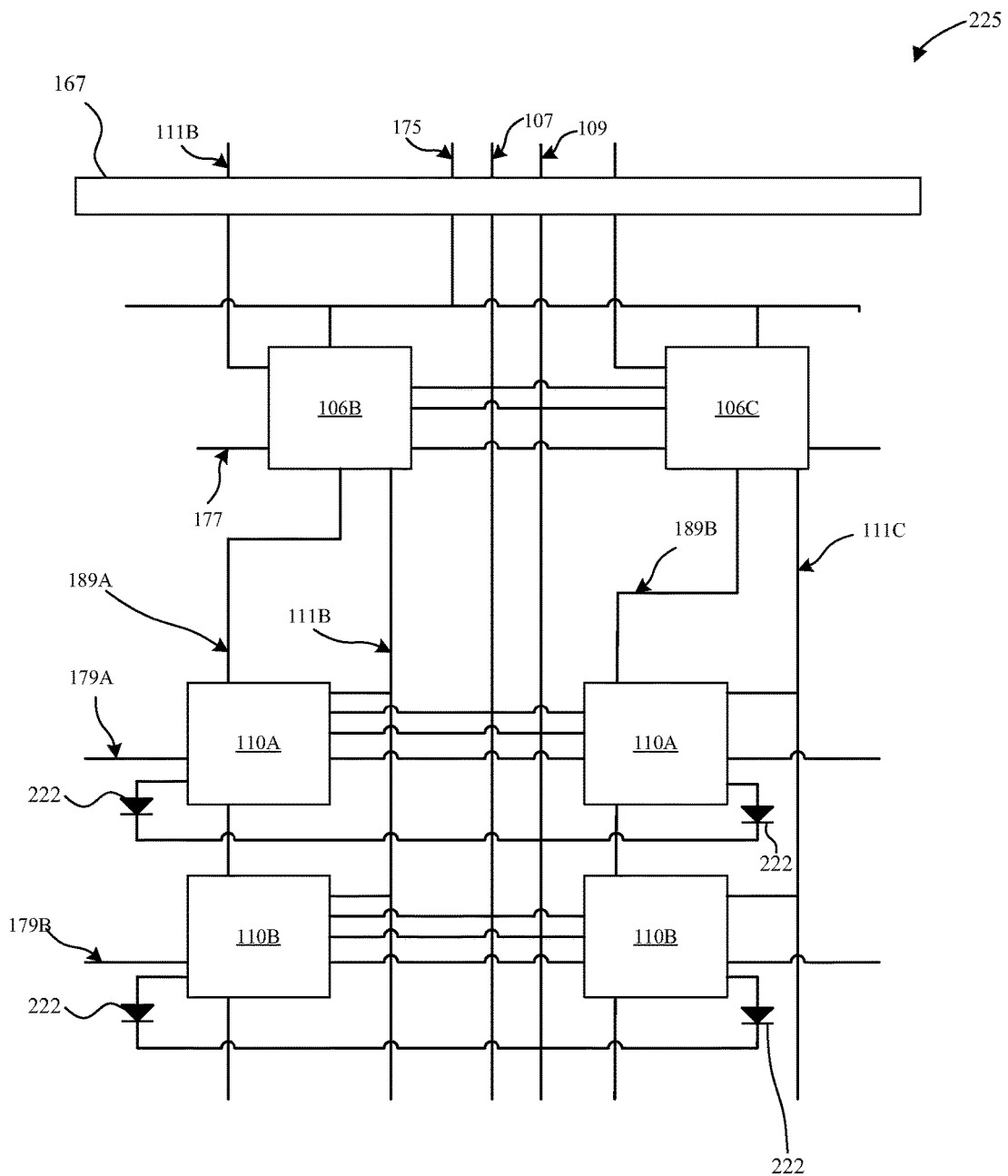
FIGS. 2C-2D are close-up overhead view illustrations of a portion of the display systems of FIGS. 2A-2B and 7 in accordance with at least two embodiments.

Referring now to FIG. 2C, which is a close-up overhead view illustration of a portion 225 of the display systems 200 and 700 of FIGS. 2A-2B and 7 in accordance with an embodiment. Portion 225 includes a panel edge pin port of the connection pin(s) 167, protection chips 106B-C, two columns of driver chips 110A-B, and a plurality of LEDs 222 connected to each of the driver chips 110A-B and $V_{SS}$. Portion 225 is provided to include additional details about the display systems 200 and 700 of FIGS. 2A-2B and 7. For the sake of brevity, the scan drivers 108A-N and the distribution lines 117A-N are omitted from FIG. 2C and its corresponding description.

In one embodiment, each of the input/output signals provided through lines 111B, 175, 107, 109, 189A, 189B is applied to protection chips 106B-C prior to being applied to the devices of display system 200 (e.g., driver chips 110A-B) to provide protection to the devices of system 200 from damage caused by one or more ESD and/or EOS events. As shown in FIG. 2C, protection chip 106B protects the first column of driver chips 110A-B while protection chip 106C protects the second column of driver chips 110A-B.

In one embodiment, an inter-protection-chip line 177 connects the protection chips 106B-C to each other to enable the protection chips 106B-C to work in parallel against ESD and/or EOS events. For example, the inter-protection-chip line 177 passes a triggering signal across multiple protection chips 106A-N to turn on all of the ESD and/or EOS protection devices within these protection chips 106A-N simultaneously when one or more ESD and/or EOS events occur. In one example, the triggering signal is generated internally (as described above in connection with FIG. 2B) and sent, via inter-protection-chip line 177, across multiple protection chips 106A-N in response to at least one of the protection chips 106A-N being triggered by one or more ESD and/or EOS events. In this example, the triggering signal that is sent by line 177 turns on the ESD and/or EOS protection devices within these protection chips 106A-N simultaneously, and as a result, the ESD and/or EOS protection capability scales up in proportion with the number of protection chips. In one embodiment, at least one signal from the panel edge pin port of the connection pin(s) 167 (not shown) is used to provide an externally generated triggering signal, as described above in connection with FIG. 2B. In one embodiment, inter-protection-chip line 177 is protected from damage caused by ESD and/or EOS events that occur between protection chips 106B-C using small protection devices (e.g., secondary ESD devices that are not shown). Additional details about protecting protection chips 106B-C from ESD and/or EOS events are described below in connection with FIG. 2D.

Figure 2D:
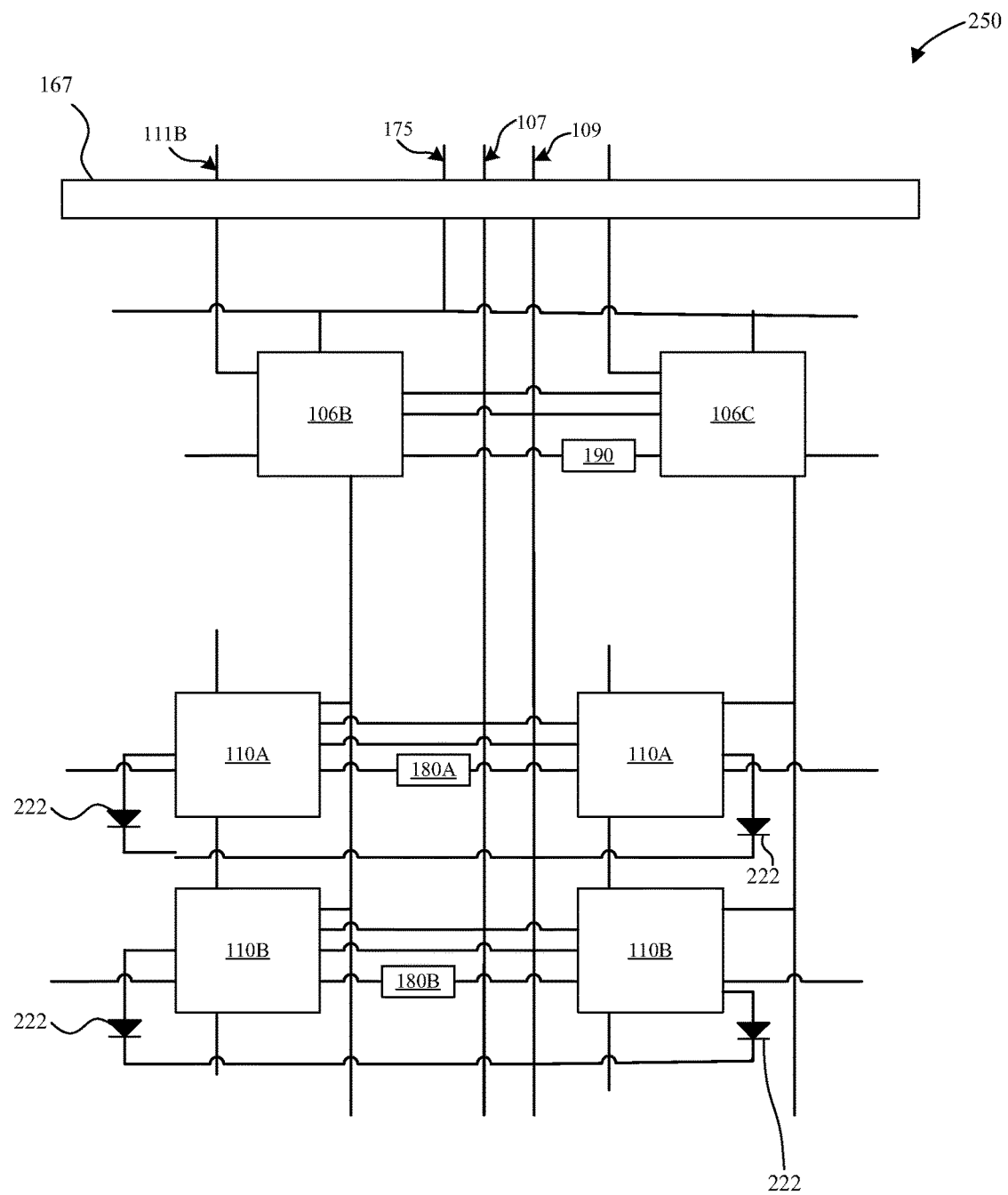

In one embodiment, FIG. 2C also includes inter-driver-chip lines 179A-B that connects a row of driver chips together. For example, inter-driver-chip line 179A connects a row of driver chips 110A to each other. In one embodiment, a small-scale protection device, as described below in FIG. 2D, is placed between each pair of driver chips in a row to provide additional ESD and/or EOS protection. Further embodiments include multiple inter-driver-chip lines 179A-B between each pair of driver chips 110A-N that are adjacent to each other. Each of inter-driver-chip lines 179A-B and inter-protection-line 177 can be a distribution line formed from a conductive metal or any other material that enables communication between the respective driver or protection chips.

FIG. 2D is close-up overhead view illustration of a portion 250 of the display systems 200 and 700 of FIGS. 2A-2B and 7 in accordance with another embodiment. Portion 250 is modification of portion 225 of FIG. 2C that is described above. In contrast to portion 225 of FIG. 2C, portion 250 includes small-scale protection devices 190 and 180A-B.

In one embodiment, each of small-scale protection devices 190 and 180A-B includes at least one of (i) a small-scale electro-static discharge (S-ESD) protection device or (ii) a small-scale electric overstress (S-EOS) protection device. The S-ESD protection device can be formed using at least one of a thyristor, a varistor, a polymer ESD device, a gas discharge tube, a gate-grounded Metal-Oxide-Semiconductor Field-Effect Transistor (MOSFET), a gate-coupled MOSFET, a silicon controlled rectifier (SCR), a medium voltage triggered SCR, or any other electronic device known to deal with rapid ESD events. The S-EOS device can be formed using a thyristor, a diode string comprising a plurality of P-N junctions that are connected in series, a bidirectional or unidirectional diode-based Transient Voltage Suppressor (TVS), or any other electronic device know to deal with slow EOS events. In one embodiment, the S-ESD and/or S-EOS protection devices of each of devices 190 and 180A-B is a smaller version of the devices of protection chips 106B-C that provide EOS and/or ESD protection to the driver chips 110A-B. In one embodiment, the scale of the S-ESD devices is related to the smaller scale of ESD and/or EOS events between driver chips inside the display systems 200 and 700. For example, in a display system 200, the majority of the ESD and/or EOS energy is dissipated by the protection devices inside the protection chips 106A-N, however, the voltage/charge differential between driver chips 110A-N inside the display system 200 is usually of such a small scale that protection against ESD and/or EOS events caused by this small scale voltage/charge differential can be taken care of by the S-ESD and/or S-EOS devices. In another example, the trigger voltage of the small-scale protection device could be lower than the trigger voltage of the protection chip 106B even though both the small-scale protection device and the protection chip 106B assist with protecting a column of driver chips 110A-B from ESD and/or EOS events. In one embodiment, the small-scale protection devices 180A-B and 190 includes at least one antenna diode for ESD and/or EOS protection.

In one embodiment, the S-ESD protection device and the S-EOS protection device of each of small-scale protection devices 180A-B are connected between one or more of signal lines (e.g., inter-driver-chip lines 179A-B), one or more of power supply lines, and the electrical ground line of system 200. In this way, each of driver chips 110A-B are provided with additional protection from ESD and EOS events. In one embodiment, small-scale protection devices 180A-B are included in each of driver chips 110A-B, as shown in FIG. 2D. In one embodiment, when at least one of the protection chips 106A-N, small protection devices 180A-B, or small protection devices 190 is triggered by one or more ESD and/or EOS events, then a triggering signal is sent across multiple protection chips 106A-N, small protection devices 180A-N, and small protection devices 190 by traces 177 and 179A-N, respectively. In this embodiment, the triggering signal turns on the ESD and/or EOS protection devices within these chips 106A-N, devices 180A-N, and devices 190 simultaneously, and as a result, ESD and/or EOS protection capability is scaled up in proportion to number of protection chips and/or small scale protection devices. Furthermore, in this embodiment, the triggering signal is generated internally by at least one of chips 110A-B, devices 180A-N, or devices 190. The one of chips 110A-B, devices 180A-N or devices 190 that generates the triggering signal provides it, via one or more signal lines, to the other chips 110A-N, devices 180A-N, and devices 190. In this way, the chips 110A-N, devices 180A-N, and devices 190 are turned on simultaneously in way that allows these chips and devices to scale up the protection they provide against ESD and/or EOS events in proportion with their numbers. In one embodiment, at least one of the signals from connector pins 167 (not shown) is used to provide an externally generated triggering signal to turn on chips 106A-N, devices 180A-B, and devices 190, as described above in connection with FIG. 2B.

Small-scale protection device 190 includes at least one of an S-ESD protection device or an S-EOS protection device. In this way, each pair of protection chips 106B-C has its devices protected from ESD and/or EOS events. In one embodiment, the S-ESD protection device provides protection for extra-ESD-sensitive devices inside protection chips 106B-C. In one embodiment, the S-ESD protection device and/or the S-EOS protection device of the small-scale protection device 190 are connected between one or more of signal lines (e.g., inter-protection-chip line 177), one or more of power supply lines, and the electrical ground line of system 200. In this way, each of protection chips 106A-B is provided with protection from ESD and/or EOS events. In one embodiment, small-scale protection devices 190 are included in each of protection chips 106A-N, as shown in FIG. 2D. In one embodiment, the small-scale protection devices 180A-B and 190 are turned on by the same triggering signal that turns on protection chips 106A-N.

In one embodiment, the small-scale protection devices 190 and 180A-N are bonded to the substrate 102 at the same time as the protection chips 106A-N. In one embodiment, the protection chips 106A-N are bonded to the display substrate 102 before the small-scale protection devices 190 and 180A-N, before the LEDs 222, before the driver chips 110A-N, before the scan drivers 108A-N, and before other devices of display system 200 are transferred onto the substrate 102. In one embodiment, the LEDs 222, the scan drivers 108A-N, the driver chips 110A-N, the small-scale protection devices 190 and 180A-N, the protection chips 106A-N, and/or other devices of display system 200 are picked up from one or more donor substrates in batches using electrostatic transfer heads that operate based on electrostatic transfer principles. In one embodiment, the driver chips 110A-N, the protection chips 106A-N, and/or the small-scale protection devices 190 and 180A-N are transferred in batches from the same donor substrate to the receiving display substrate 102. In one embodiment, the driver chips 110A-N, the protection chips 106A-N, and/or the small-scale protection devices 190 and 180A-B are transferred at the same time.

In one embodiment, the small-scale protection devices 190 and 180A-B are micro small-scale protection devices with a length and/or width that ranges from one µm to 300 µm, or more specifically, between that ranges from 20 µm to 300 µm. In one embodiment, display system 200 has a predetermined resolution, a predetermined pixel density, and/or a predetermined subpixel density that restricts the sizes of devices that can be included in system 200. In one embodiment, the small-scale protection devices are scalable with regard to the predetermined resolution, the predetermined pixel density, and/or the predetermined subpixel density of display system 200. For example, system 200 is a display system with a 40 PPI (pixels per inch) and 210 µm subpixel pitch. In this example, driver chips 110A-N, the LEDs 222, and the small-scale protection devices 190 and 180A-B that make up the system 200 would have to be small enough to fit between the subpixels, i.e., the driver chips 110A-N, the LEDs 222, and the small-scale protection devices 190 and 180A-B would have to be micro devices that are smaller than 210 µm. In another example, system 200 is a display system with a 440 PPI (pixels per inch) and 19 µm subpixel pitch. In this example, driver chips 110A-N, the LEDs 222, and the small-scale protection devices 190 and 180A-B that make up the system 100 would have to be small enough to fit between the subpixels, i.e., the driver chips 110A-N, the LEDs 222, and the small-scale protection devices 190 and 180A-B would have to be micro devices that are smaller than 19 µm. As illustrated in the preceding examples, protection against ESD and/or EOS events can be important for a display system 200 that has micro devices, and the small-scale protection devices 190 and 180A-B can be included on the display area of system 200 to assist with protecting the devices of system 200 from damage caused by ESD and/or EOS events, even though the resolution, pixel density and/or subpixel density of system 200 restricts the sizes of devices that can be in the display area of system 200.

Figure 3A:
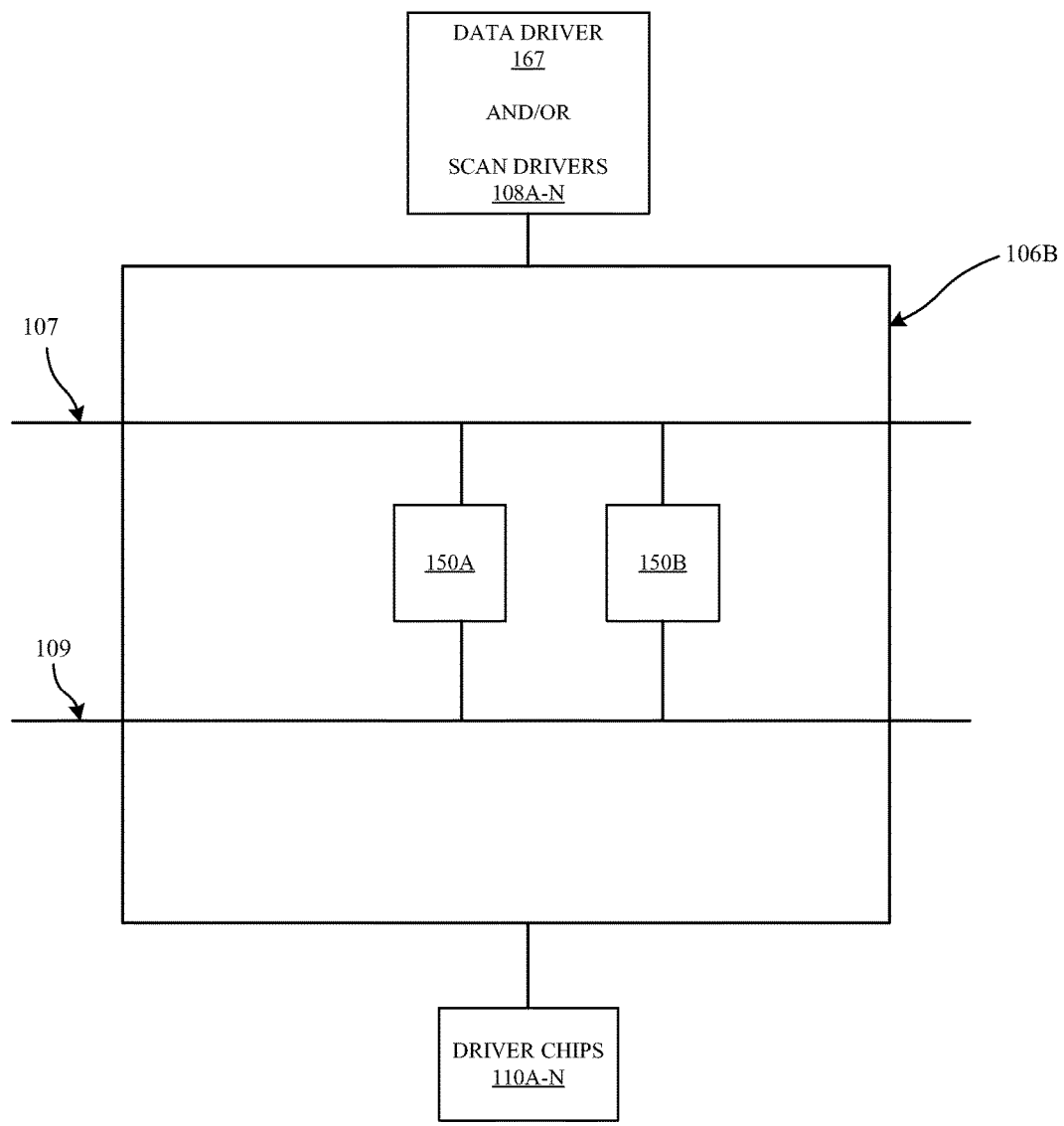
FIG. 3A is a block diagram illustration of a protection chip from the display systems of FIGS. 2A-2B and 7 in accordance with an embodiment.

FIG. 3A is a block diagram illustration of a protection chip 106B from the display systems 200 and 700 of FIGS. 2A-2B and 7 in accordance with an embodiment. As described above in FIGS. 2A-2D, protection chip 106B can include one or more ESD protection devices 150A and one or more EOS protection devices 150B. In one embodiment, the ESD protection devices 150A and the EOS protection devices 150B are connected in parallel between $V_{DD}$ (lines 107) and $V_{SS}$ (line 109). In one embodiment, the protection chip 106B is connected between the connector pin(s) 167 and a group of driver chips 110A-N (and/or scan drivers 108A-N). In this way, the protection chip 106B can assist with protecting the driver chips 110A-N (and/or scan drivers 108A-N) from damage caused by ESD and/or EOS events that occur during fabrication of system 200, during connecting of a flex cable to system 200, or during the shipping, handling, maintenance, or field operation of system 200. In one embodiment, each of the ESD and/or EOS protection devices 150A-B is formed in accordance with at least one of the descriptions provided above in connection with FIGS. 2A-2D. FIG. 3A is described with reference to driver chips 110A-N (and/or scan drivers 108A-N), however, other devices of systems 200 and 700 can be connected to the protection 106B through connector pin(s) 167, $V_{DD}$, and $V_{SS}$.

Figure 3B:
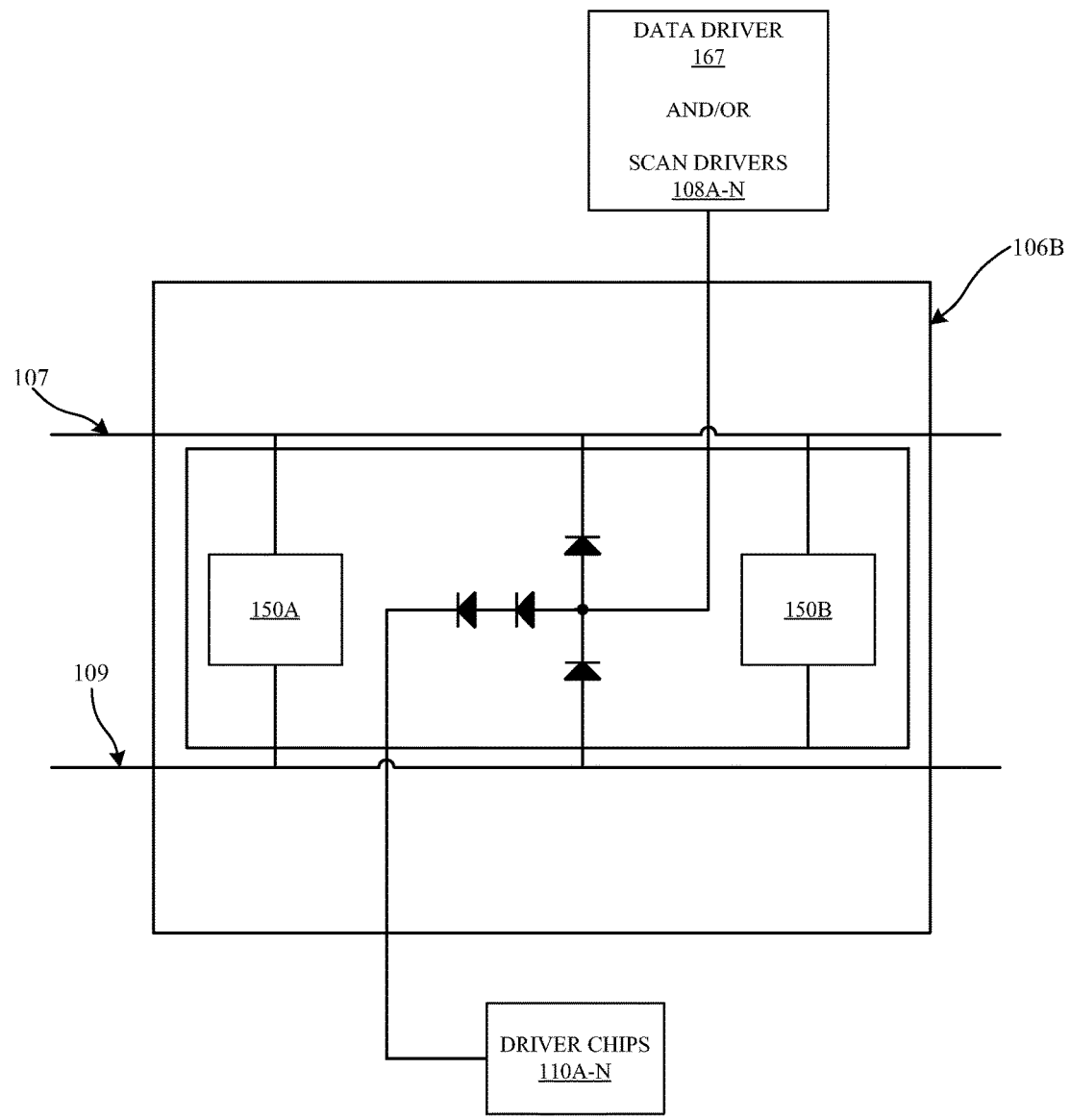
FIG. 3B is a block diagram illustration of the protection chip of FIG. 3A that includes a schematic circuit of an exemplary protection scheme in accordance with an embodiment.

FIG. 3B is a block diagram illustration of the protection chip 106B of FIG. 3A that includes a schematic circuit of an exemplary protection scheme in accordance with an embodiment. In one embodiment, the protection chip 106B of FIG. 3B is a micro protection chip having a length and/or width that ranges from 20 µm to 300 µm. In one embodiment, the protection chip 106B has at least four pins for receiving signals from connector pin(s) 167 and providing the received signals to driver chips 110A-N (and/or scan drivers 108A-N). In one embodiment, the protection chip 106B has two pins that are each for receiving $V_{DD}$ and $V_{SS}$, respectively, and providing $V_{DD}$ and $V_{SS}$ to driver chips 110A-N (and/or scan drivers 108A-N). In the illustrated embodiment of protection chip 106B, an exemplary dual-diode protection scheme made up of two diodes 301A-B and a buffer gate 305 (i.e., two inverters connected in series) is used to connect the connector pins 167, $V_{DD}$, and $V_{SS}$ to the driver chips 110A-N (and/or scan drivers 108A-N).

Even though a dual-diode protection scheme is used in the illustrated embodiment of FIG. 3B, other embodiments are not so limited. The dual-diode protection scheme is merely one example of many protection schemes known in the art. FIG. 3B is described with reference to driver chips 110A-N (and/or scan drivers 108A-N), however, other devices of systems 200 and 700 can be connected to the protection 106B through connector pin(s) 167, $V_{DD}$, and $V_{SS}$.

The protection chip 106B includes ESD and EOS protection devices 150A-B that are connected in parallel between $V_{DD}$ and $V_{SS}$. In this way, each of the signals from the connector port(s) 167, as well as $V_{DD}$ and $V_{SS}$, pass through protection chip 106B. This enables protection chip 106B to assist in protecting driver chips 110A-N from damage caused by ESD and/or EOS events. In one embodiment, each of protection devices 150A-B includes at least one circuit or device to assist with protecting against damage from ESD and/or EOS events that result from gradual and/or rapid buildup in the voltage of substrate 102. Voltage buildup is described above in connection with FIGS. 1A-1C.

Figure 4A:
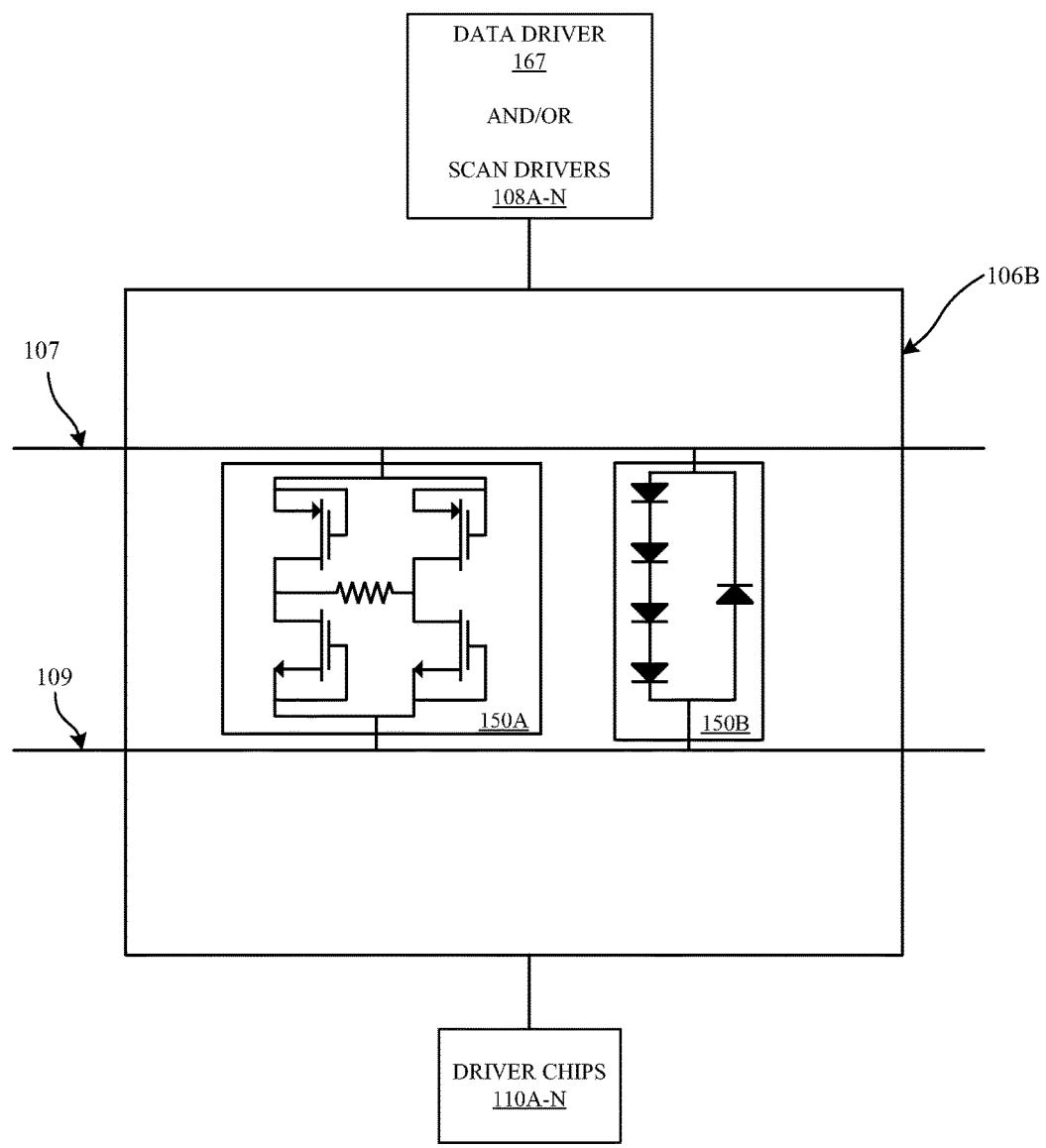
FIGS. 4A-4B are exemplary circuit configurations of ESD protection devices and EOS protection devices within the protection chip of FIGS. 3A-3B in accordance with an embodiment.
Figure 4B:
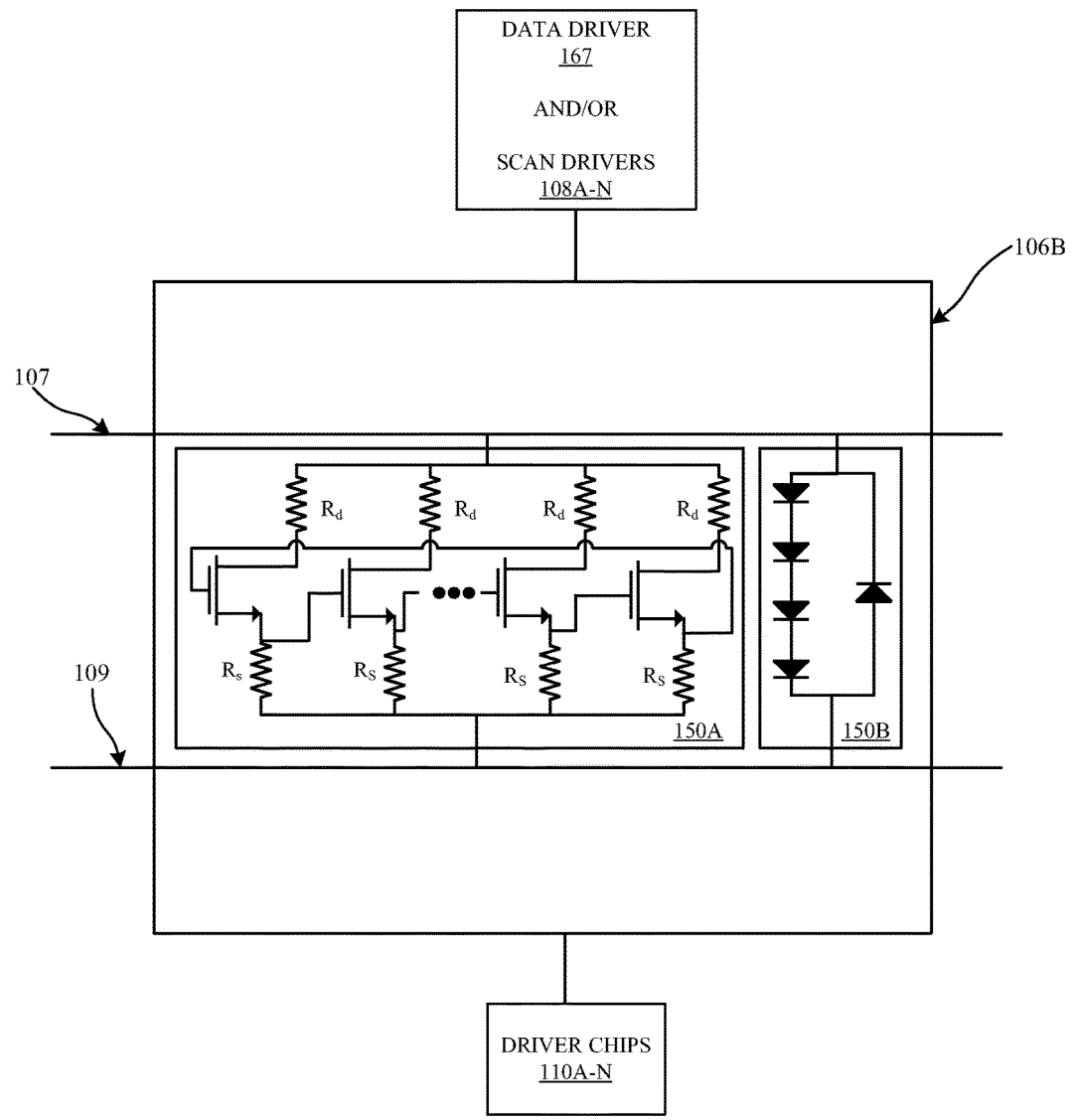

FIGS. 4A-4B are exemplary circuit configurations of ESD protection devices 150A and EOS protection devices 150B within the protection chip 106B of FIGS. 3A-3B in accordance with an embodiment. FIGS. 4A-4B are non-limiting examples given that ESD protection device 150A can include any device known in the art to assist with protection against damage caused by one or more ESD events and that EOS protection device 150B can be any device known in the art to assist with protection against damage caused by one or more EOS events. For the sake of brevity, the circuitry in FIG. 3B is omitted from FIGS. 4A-4B.

In FIGS. 4A-4B, the ESD protection device 150A can be a circuit having multiple primary and secondary ESD protection stages. For example, and as shown in FIG. 4B, the ESD protection device 150A is a circuit having multiple stages as represented by the NMOS's of the circuit. Each stage includes a first resistor ($R_d$) connected to the drain of the NMOS in the stage, a second resistor ($R_S$) connected to the source of the NMOS, and a gate of the NMOS is connected the second resistor ($R_S$) of the preceding stage. In this example, the first resistors ($R_d$) act as ballast resistors and the second resistors ($R_S$) sense ESD current and generate a voltage that is applied to the gate of the adjacent stage. Furthermore, in embodiments having multiple protection chips 106A-N (as described above in connection with FIGS. 2A-2C), the ballast resistors ($R_d$) enhance uniform current flow in the ESD and/or EOS protection devices in the multiple protection chips 106A-N to encourage scalability of ESD and/or EOS protection levels. The EOS protection device 150B can include a diode string comprising a plurality of P-N junctions. Furthermore, at least one diode can be connected in parallel with the diode string, in the opposite P-N polarity, to provide EOS protection for reverse-biased stress. In the illustrated examples of FIGS. 4A-4B, the ESD and EOS devices 150A-B are connected in parallel between the $V_{DD}$ and the $V_{SS}$ lines to protect devices on or bonded to the substrate 102, as described above in connection with FIGS. 2A-3B.

It is to be appreciated that even though each of devices 150A-B are shown in FIGS. 3A-4B, the protection chip 106B can include at least one of 150 A or 150B.

Figure 5A:
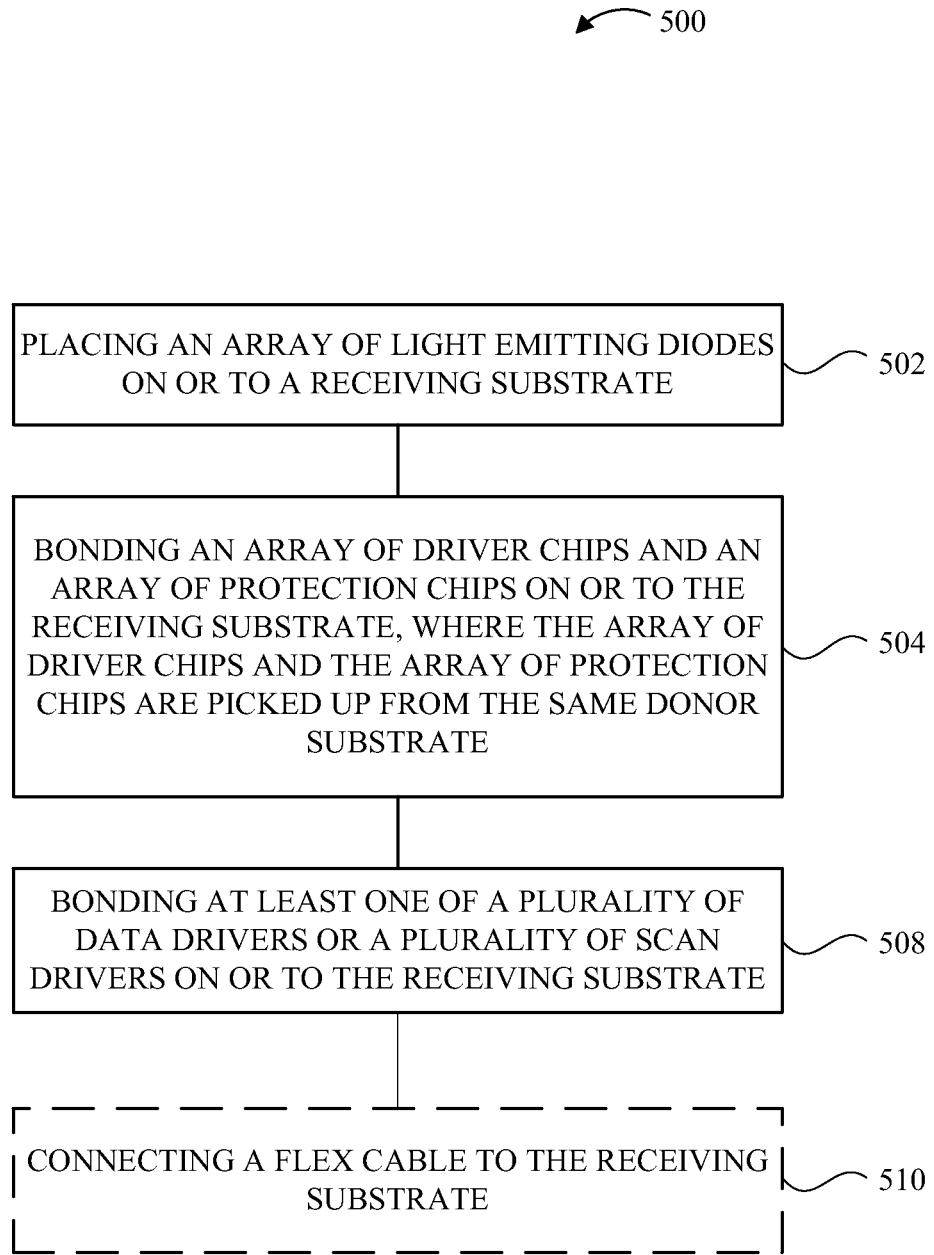
FIG. 5A is a process flow illustration of a method of fabricating a display system that includes protection against damage caused by ESD and/or EOS events in accordance with one embodiment.

FIG. 5A is a process flow illustration of a method 500 of fabricating a display system that includes protection against ESD and/or EOS events in accordance with an embodiment. At block 502, an array of protection chips are transferred onto (i.e., placed on or bonded to) a receiving substrate. For example, transferring the array of protection chips onto the receiving substrate includes picking up of the array of protection chips from a donor substrate with an electrostatic transfer head assembly supporting an array of electrostatic transfer heads, contacting the receiving display substrate with the array of protection chips, transferring thermal energy from the array of electrostatic transfer head assembly to bond the array of protection chips onto the conductive paths on receiving display substrate, and releasing the array of protection chips onto the receiving display substrate. In one embodiment, the protection chips are picked up from the donor substrate and placed on the receiving substrate as described above in connection with FIGS. 2A-2C.

At block 504, an array of driver chips is bonded to the receiving display substrate. In one embodiment, the array of driver chips is bonded to the receiving substrate after the array of protection chips has been transferred onto the receiving substrate. In one embodiment, the array of driver chips and the array of protection chips are bonded to the receiving substrate at the same time. In one embodiment, the array of driver chips and the array of protection chips are picked up from the same donor substrate, as described above in connection with FIGS. 2A-2C. In one embodiment, the protection chips are bonded to the receiving substrate before the driver chips are bonded to the receiving substrate. With the protection chips being the first devices bonded to the receiving substrate, any undesired voltage or current from one or more ESD and/or EOS events can be absorbed by the protection chips so that the electrostatic charges and energy are dissipated, and voltage/current spikes are clamped. This assists with protection of the LEDs, the driver chips, and/or the other devices of the display system from damage caused by one or more ESD and/or EOS events. In one embodiment, the protection chips clamp the voltage of the metal traces of the receiving substrate to a safe range so the driver chips and other devices of the display system are protected from damage caused by one or more ESD and/or EOS events as the devices of the system are being transferred onto the receiving substrate.

At block 506, at least one of a plurality of scan drivers is bonded to a receiving substrate. In one embodiment, the scan driver(s) are bonded to the receiving display substrate as described above in connection with FIGS. 2A-2C.

At block 508, an array of LEDs is transferred onto (i.e., bonded to or placed on) a receiving substrate. For example, the placement of the array of LEDs on the receiving substrate includes picking up of the array of LEDs from a donor substrate with an electrostatic transfer head assembly supporting an array of electrostatic transfer heads, contacting the receiving display substrate with the array of LEDs, transferring thermal energy from the array of electrostatic transfer head assembly to bond the array of LEDs to the conductive paths on receiving display substrate, and releasing the array of LEDs onto the receiving display substrate. In one embodiment, the array of LEDs is picked up from the donor substrate and placed on the receiving substrate as described above, with regard to FIGS. 2A-2C.

At block 510, a flex cable can optionally be connected to the receiving substrate. In one embodiment, the flex cable is connected to the receiving substrate as described above in connection with FIGS. 1A-2C. In one embodiment, the connection of flex cable to the receiving substrate is done after the LEDs, the driver chips, the protection chips, the scan drivers, and/or the other devices of the display system are on the receiving substrate. In this way, the protection chips can assist with protecting the devices on the receiving substrate and/or the receiving substrate itself from damage caused by one or more EOS and/or ESD events that occur during the connection of the flex cable to the substrate.

Figure 5B:
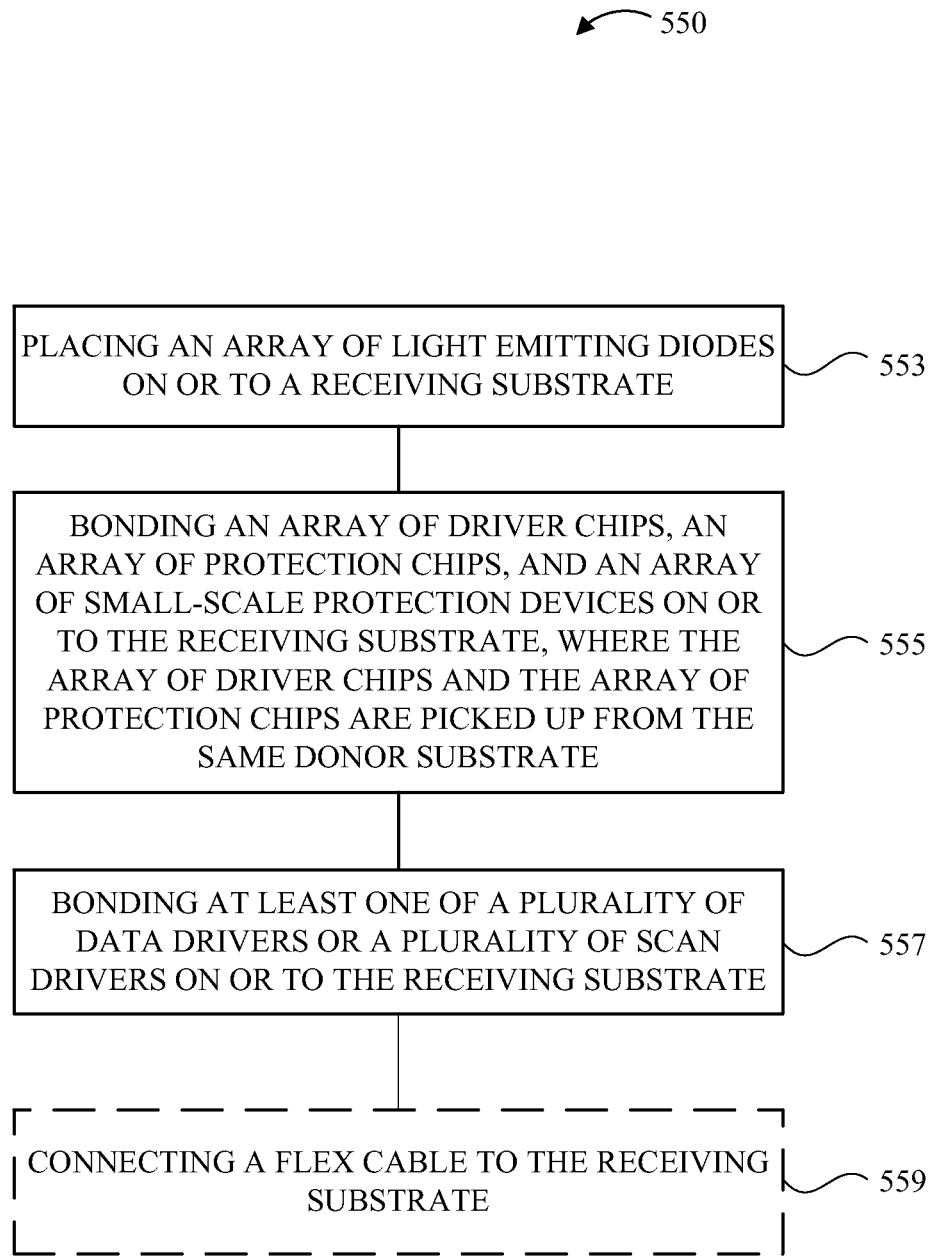
FIG. 5B is a process flow illustration of a method of fabricating a display system that includes protection against ESD and/or EOS events in accordance with another embodiment.

FIG. 5B is a process flow illustration of a method 550 of fabricating a display system that includes protection against ESD and/or EOS events in accordance with another embodiment. Method 550 is a modification of the method 500 described above in connection with FIG. 5A. For the sake of brevity, only the differences between method 550 and method 500 are described in connection with FIG. 5B.

In contrast with method 500, method 550 includes two additional blocks 553 and 555. At block 553, a first array of small-scale protection devices is bonded to the receiving display substrate between each pair of protection chips to protect one or more devices of the protection chips from ESD and/or EOS events. In one embodiment, the first array of small-scale protection devices is bonded to the receiving substrate, as described above in connection with FIGS. 2C-2D. In one embodiment, the array of protection chips is bonded to the substrate before the first array of small-scale protection devices is bonded to the receiving substrate.

Figure 6A:
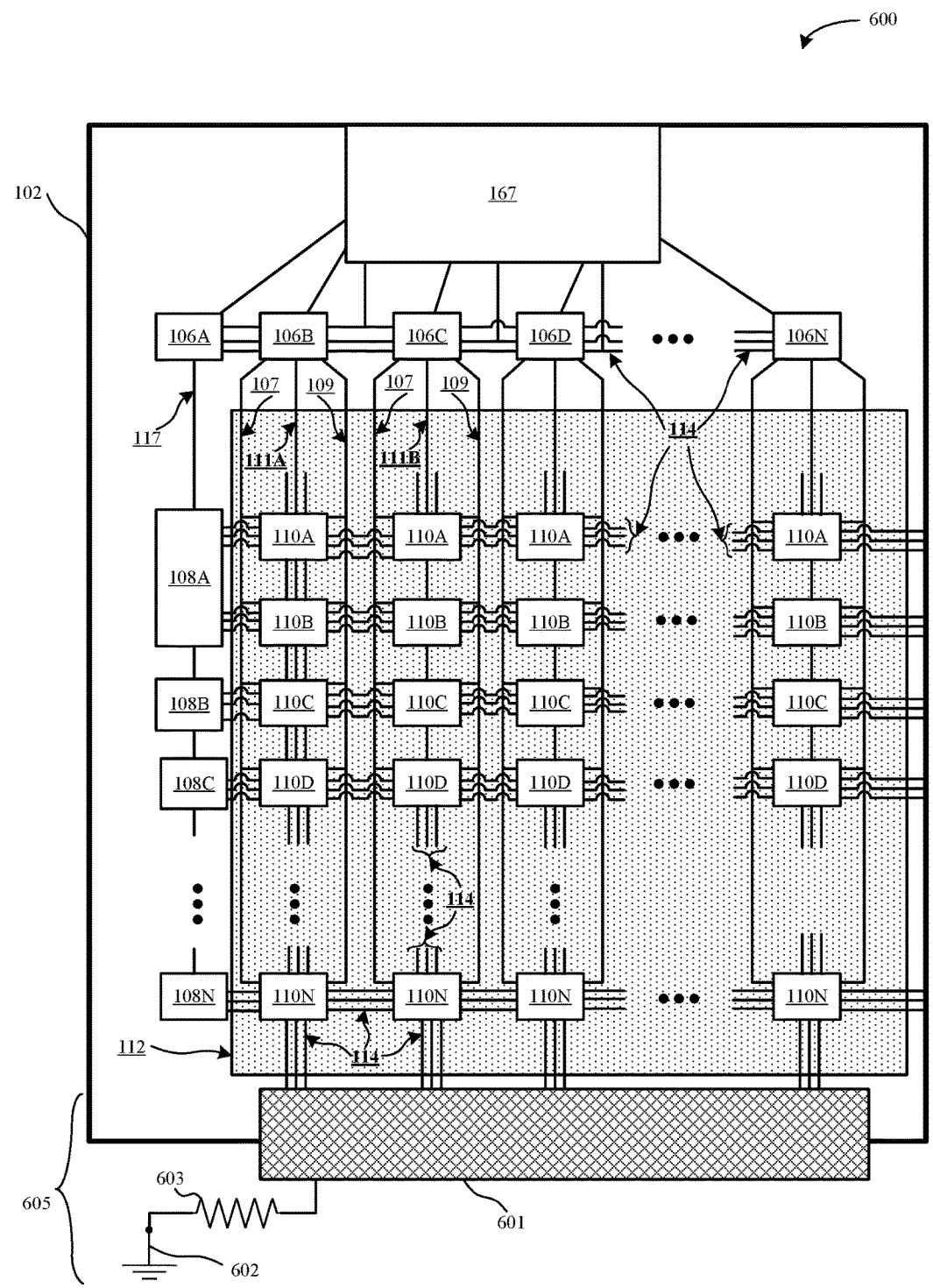
FIGS. 6A-6D are overhead view illustrations of manner of fabricating a display system that includes protection against damage caused by ESD and/or EOS events in accordance with one embodiment.
Figure 6B:
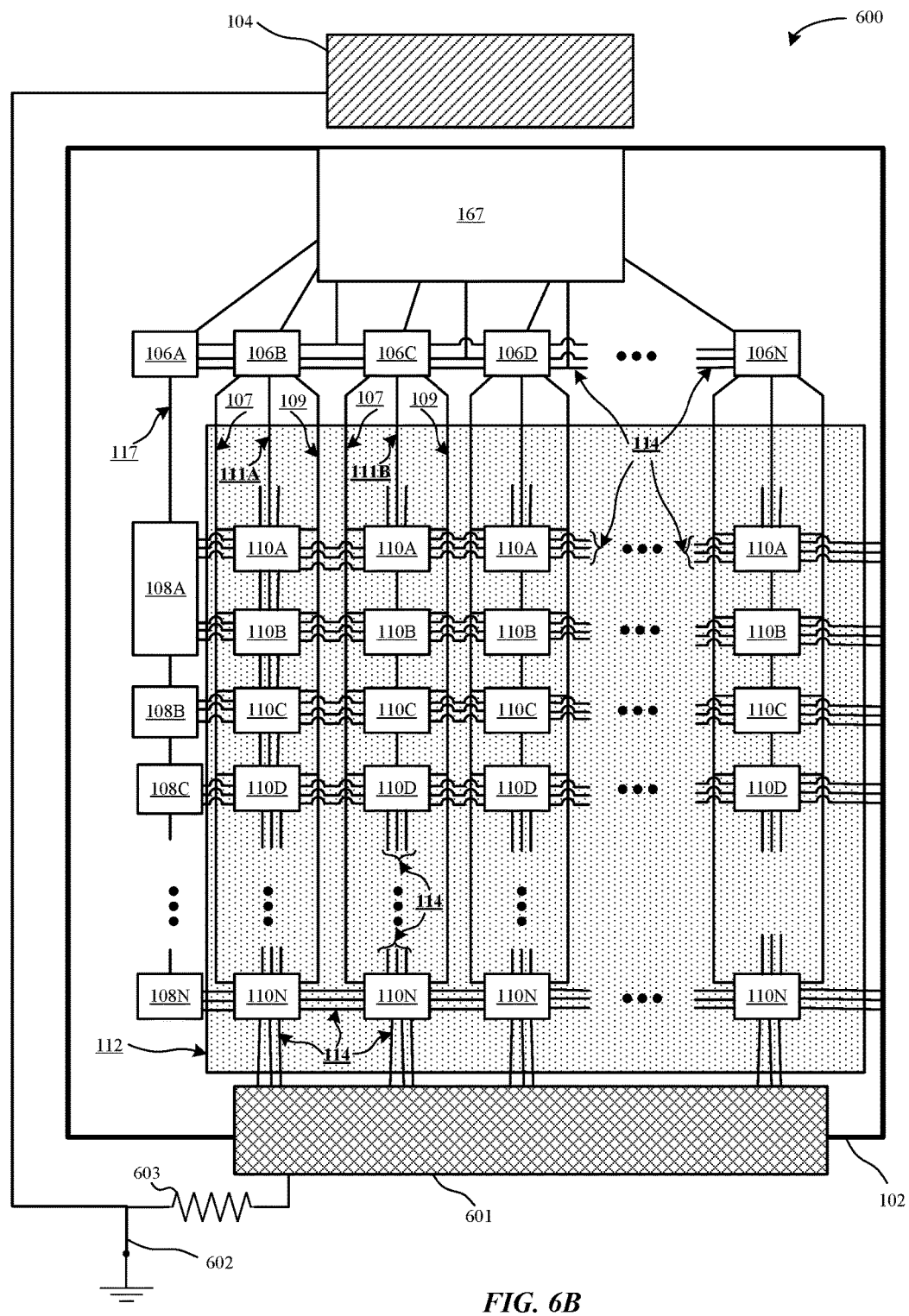

At block 555, a second array of small-scale protection devices is bonded to the receiving display substrate between each pair of driver chips to provide additional protection to the driver chips against ESD and/or EOS events. In one embodiment, the second array of small-scale protection devices is bonded to the receiving substrate, as described above in connection with FIGS. 2C-2D. In one embodiment, the array of protection chips and the array of driver chips are bonded to the substrate before the second array of small-scale protection devices is bonded to the receiving substrate. In one embodiment, the array of protection chips, the first array of small-scale protection devices, and the array of driver chips are bonded to the substrate before the second array of small-scale protection devices is bonded to the receiving substrate Alternative ESD and/or EOS Protection:

FIGS. 6A-6D are overhead view illustrations of manner of fabricating a display system 600 that includes protection against damage caused by ESD and/or EOS events in accordance with one embodiment. In one embodiment, the protections against damage caused by ESD and/or EOS events, as described below in connection with FIGS. 6A-6B, are used instead of or in combination with the protection chips 106A-N that are described above.

FIG. 6A is an overhead view illustration of a display system 600 that includes protection against damage caused by ESD and/or EOS events during fabrication of the display system 600 in accordance with an embodiment. System 600 of FIG. 6A is a modification of system 200 of FIG. 2B. In contrast with system 200, the flex cable 104 has not been connected to system 600 yet even though all the other devices are on substrate 102. System 600 is further contrasted from system 200 because system 600 includes a discharge circuit 605.

In one embodiment, the discharge circuit 605 includes a metal clamp 601 that is connected in series to a large resistor 603 and ground 601. In one embodiment, the metal clamp 601 is made from any metal, metal alloy, or combination thereof that allows for the conduction of electricity. In one embodiment, the large resistor has value that is at least approximately one MΩ. In one embodiment, ground 602 is electrical ground ($V_{SS}$). In one embodiment, the discharge circuit 605 protects the devices of system 600 from damage caused by one or more ESD and/or EOS events as described below in connection with FIGS. 6A-6B.

In one embodiment, the flex cable 104 is connected to substrate 102 after the array of LEDs 222, the array of driver chips 110A-N, the scan drivers 108A-N, and/or one or more other devices of system 600 are on the substrate 102. In one embodiment, the act of connecting the substrate 102 to the flex cable 104 or the act of testing the devices on the substrate 102 can cause the substrate 102 to have a floating potential, which can lead to unwanted ESD and/or EOS events. In this embodiment, ESD and/or EOS events may occur even when the flex cable 104 includes ESD and/or EOS protection devices that can protect the cable 104 and the substrate 102 from ESD and/or EOS events after the cable 104 and the substrate 102 are connected to each other. Accordingly, in one embodiment, ESD and/or EOS protection is needed prior to and during the connection of the cable 104 with the substrate 102. In one embodiment, the substrate 102 is connected to the discharge circuit 605 to ensure that the substrate 102 and the flex cable 104 are protected from damage prior to and during the act of being connected to each other.

In one embodiment, the discharge circuit 605 is connected to substrate 102 prior to the devices of system 600 being placed on or bonded to substrate 102 to protect the fabrication of system 600 (and the devices of system 600) from damage caused by ESD and/or EOS events. In one embodiment, the discharge circuit 605 acts a short circuit that prevents the metal traces 114 from being subjected to gradual or rapid increases in voltage as devices of system 600 are placed on or bonded to substrate 102. In this way, the metal traces connected to the $V_{DD}$ and the $V_{SS}$ of the substrate 102 have at least approximately equal potentials, which assists with preventing one or more ESD and/or EOS events. In one embodiment, testing of system 600 is performed after the flex cable 104 and substrate 102 have been connected to each other.

FIG. 6B is an overhead view illustration of a display system 600 that includes protection against damage caused by ESD and/or EOS events prior to connecting the flex cable 104 to the substrate 102. In one embodiment, the flex cable 104 is connected to the discharge circuit 605, which includes the metal clamp 601, the large resistor 603 and the ground 602. In one embodiment, after the flex cable is connected to the discharge circuit 605, the substrate 102 and the flex cable 104 are discharged until the potentials of the substrate 102 and the cable 104 are at least approximately equal.

Figure 6C:
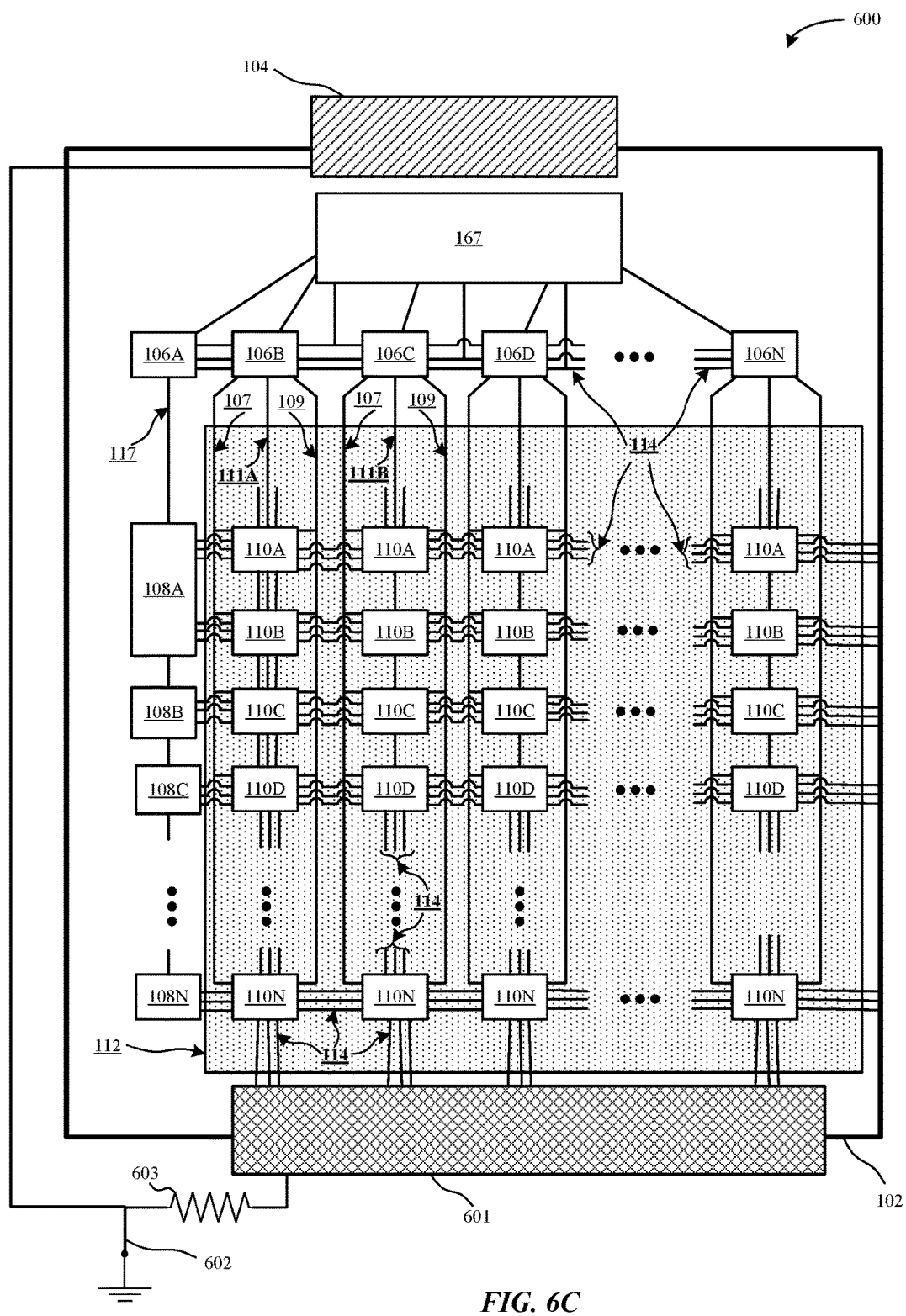

FIG. 6C is an overhead view illustration of a display system 600 that includes protection against damage caused by ESD and/or EOS events during the connecting of the flex cable 104 to the substrate 102. In one embodiment, when the potentials of the substrate 102 and the cable 104 are at least approximately equal, the flex cable 104 is connected to substrate 102, as shown in FIG. 6C.

Figure 6D:
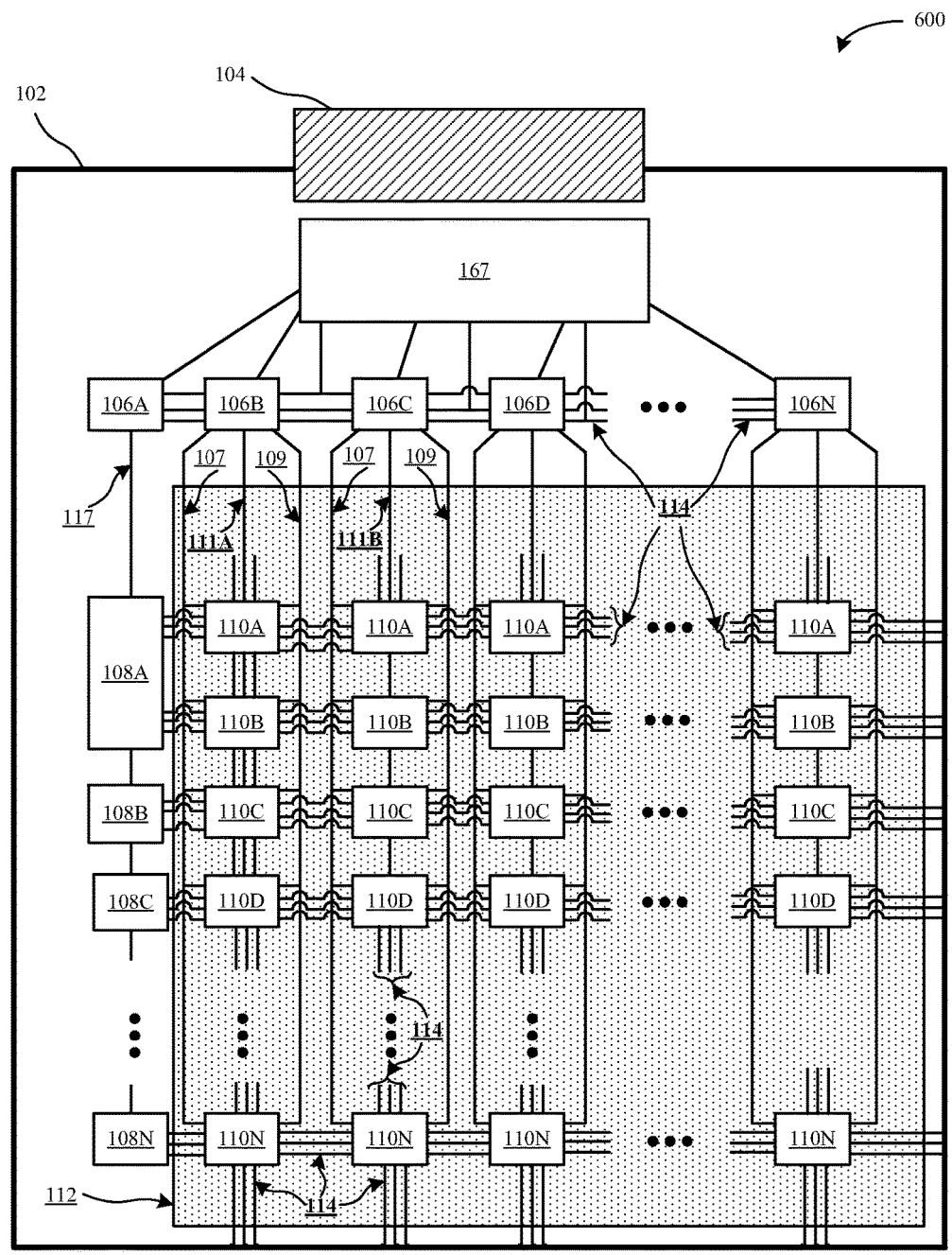

FIG. 6D is an overhead view illustration of a display system 600 that includes protection against damage caused by ESD and/or EOS events after the flex cable 104 is connected to the substrate 102. In one embodiment, after the flex cable is connected to substrate 104, the discharge circuit 605 is disconnected from substrate 102 and cable 104, as shown in FIG. 6D.

In utilizing the various aspects of the embodiments, it would become apparent to one skilled in the art that combinations or variations of the above embodiments are possible for protecting electronic systems (e.g., display systems) from ESD and/or EOS events. Although the embodiments have been described in language specific to structural features and/or methodological acts, it is to be understood that the appended claims are not necessarily limited to the specific features or acts described. The specific features and acts disclosed are instead to be understood as embodiments of the claims useful for illustration.

What is claimed is:

1. A display system comprising:
   a display substrate;
   an array of light emitting diodes (LEDs) on the display substrate;
   a first driver chip bonded to the display substrate, the first driver chip to drive a first group of LEDs of the array of LEDs;
   a second driver chip bonded to the display substrate, the second driver chip to drive a second group of LEDs of the array of LEDs;
   a plurality of protection chips bonded to the display substrate, wherein each protection chip of the plurality of protection chips includes one or more electro-static discharge (ESD) protection devices, wherein:
   the plurality of protection chips includes a first protection chip and a second protection chip that are directly connected to one another through one or more signal lines of the display substrate, one or more power supply voltage lines of the display substrate, and an electrical ground line of the display substrate, and an inter-protection chip line interposed between each of the plurality of protection chips and directly connecting only the plurality of protection chips to each other in order to operate the first and second protection chips in parallel; and
   the first protection chip is to assist with protecting the first and second driver chips from damage caused by an ESD event.

2. The display system of claim 1, wherein:
   at least one of the first driver chip, the second driver chip, the first protection chip, or one or more of the LEDs in the array of LEDs is a micro device.

3. The display system of claim 1, wherein:
   each protection chip of the plurality of protection chips further comprises one or more electric overstress (EOS) protection devices; and
   the first protection chip is to assist with protecting the first and second driver chips from damage caused by an EOS event.

4. The display system of claim 1, further comprising:
   a flex cable connected to the display substrate, the flex cable including a timing controller (TCON), wherein:
   the flex cable is connected to the signal lines, the power supply lines, and the electrical ground line;
   the flex cable is located at an edge of a first contact ledge of the display substrate, and
   a first protection chip is bonded to the display substrate at a location between a display region of the display substrate and the first contact ledge.

5. The display system of claim 4, further comprising:
   a first data driver connected to the display substrate through the flex cable, the first data driver to provide a first display driver signal to the first and second driver chips, wherein:
   the first data driver is mounted on the flex cable;
   the first data driver is to receive a first input signal from one or more of the signal lines, and the first input signal is to be processed by the first data driver into the first display driver signal.

6. The display system of claim 5, further comprising:
   a third driver chip bonded to the display substrate the third driver chip to drive a third group of LEDs of the array of LEDs; wherein:
   the first and second driver chips are arranged on the display substrate as a first column,
   the first and third driver chips are arranged on the display substrate as a first row,
   the third driver chip is arranged on the display substrate as a second column,
   the second driver chip is arranged on the display substrate as a second row,
   the second protection chip is to assist with protecting the third driver chip from an ESD event, and
   the second protection chip is bonded to the display substrate at a location between the display region of the display substrate and the first contact ledge.

7. The display system of claim 6, wherein:
   at least one of the third driver chip or the second protection chip is a micro device.

8. The display system of claim 6, further comprising:
   a second data driver connected to the display substrate through the flex cable, the second data driver to provide a second display driver signal to the third driver chip, wherein:
   the second data driver is mounted on the flex cable;
   the second data driver is to receive a second input signal from one or more of the signal lines,
   the second input signal is to be processed by the second data driver into the second display driver signal, and
   the second display driver signal is different from the first display driver signal.

9. The display system of claim 8, further comprising:
   a scan driver on the display substrate, the scan driver to select at least one of the first row or the second row via one or more selection signals provided through one or more of the signal lines, wherein:
   the scan driver is bonded to the display substrate at a location between a display region of the display substrate and a second contact ledge of the display substrate;
   each of the first and second data drivers is to provide the respective display driver signals to the respective driver chips when the respective driver chips are in the selected row.

10. The display system of claim 9, wherein:
    the plurality of protection chips includes a third protection chip bonded to the display substrate, wherein:
    the second protection chip and the third protection chip are directly connected to one another through one or more of the signal lines, one or more of the power supply voltage lines, and the electrical ground line,
    the third protection chip is to assist with protecting the scan driver from an ESD event, and
    the third protection chip is bonded to the display substrate at a location between the display region of the display substrate and the first contact ledge.

11. The display system of claim 10, wherein:
at least one protection chip of the plurality of protection chips further comprises a small-scale protection device.

12. The display system of claim 10, wherein:
at least two of the driver chips are connected to each other via an inter-driver-chip signal line, and
at least one of the driver chips further comprises a small-scale protection device.

13. The display system of claim 10, wherein:
one or more signals are provided, via the signal lines, to at least one of the protection chips of the plurality of protection chips prior to the one or more signals being provided to the respective driver chips; and
one or more power supply voltages are provided, via the power supply voltage lines, to at least one of the protection chips of the plurality of protection chips prior to the one or more power supply voltages being provided to the respective driver chips.

14. A method comprising:
bonding a plurality of protection chips to a receiving display substrate, each of the protection chips comprises one or more electro-static discharge (ESD) protection devices;
bonding an array of driver chips to the receiving display substrate;
transferring an array of light emitting diodes (LEDs) onto the receiving display substrate, wherein:
each of the driver chips is to drive at least one of the LEDs,
each of the protection chips is to assist with protecting at least one of the driver chips from an ESD event;
the plurality of protection chips includes a first protection chip and a second protection chip that are directly connected to one another through one or more signal lines of the receiving display substrate, one or more power supply voltage lines of the receiving display substrate, and an electrical ground line of the receiving display substrate, and an inter-protection chip line interposed between each of the plurality of protection chips and directly connecting only the plurality of protection chips to each other in order to operate the first and second protection chips in parallel; and
the plurality of protection chips are connected to the array of driver chips via one or more of the signal lines, one or more of the power supply voltage lines, and the electrical ground line.

15. The method of claim 14, wherein:
at least one of the protection chips further comprises one or more electric overstress (EOS) protection devices;
the at least one protection chip having the one or more EOS device is to assist with protecting at least one of the driver chips from an EOS event.

16. The method of claim 14, wherein:
the bonding of plurality of protection chips, the bonding of the array of driver chips, and the transferring of the array of LEDs is performed in one or more batches.

17. The method of claim 14, further comprising:
connecting a flex cable to the receiving display substrate, wherein:
the flex cable includes a timing controller (TCON),
the flex cable is connected to the signal lines, the power supply lines, and the electrical ground line;
the flex cable is located at an edge of a contact ledge of the receiving display substrate;
connecting at least one of the protection chips to the flex cable, wherein:
the at least one protection chip connected to the flex cable is bonded to the receiving display substrate at a location between a display region of the receiving display substrate and the edge of the contact ledge.

18. The method of claim 14, further comprising:
connecting a discharge circuit to the display substrate, wherein the discharge circuit is connected to the display substrate prior to the plurality of protection chips, the array of driver chips, and the array of LEDs being bonded or transferred onto the display substrate;
connecting a flex cable to the discharge circuit, wherein the flex cable is connected to the discharge circuit prior to being connected to the display substrate;
discharging, by the discharge circuit, the display substrate and the flex cable until potentials of the display substrate and the flex cable are at least approximately equal;
connecting the flex cable to the display substrate; and
disconnecting the flex cable and the display substrate from the discharge circuit.

19. The method of claim 14, further comprising:
providing one or more signals, via the signal lines, to the plurality of protection chips prior to the one or more signals being provided to the array of driver chips; and
providing one or more power supply voltages, via the power supply voltage lines, to the plurality of protection chips prior to the one or more power supply voltages being provided to the array of driver chips.

20. The method of claim 14, wherein at least one of one or more driver chips of the array of driver chips, one or more protection chips of the protection chips plurality of protection chips, or one or more LEDs of the array of the LEDs is a micro device.

* * * * *